(12) United States Patent
Ishibashi et al.

(10) Patent No.: US 7,919,343 B2
(45) Date of Patent: Apr. 5, 2011

(54) GROUP III NITRIDE CRYSTAL AND METHOD FOR SURFACE TREATMENT THEREOF, GROUP III NITRIDE STACK AND MANUFACTURING METHOD THEREOF, AND GROUP III NITRIDE SEMICONDUCTOR DEVICE AND MANUFACTURING METHOD THEREOF

(75) Inventors: Keiji Ishibashi, Itami (JP); Naoki Matsumoto, Itami (JP); Masato Irikura, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 154 days.

(21) Appl. No.: 12/432,105

(22) Filed: Apr. 29, 2009

(65) Prior Publication Data

US 2009/0273060 A1 Nov. 5, 2009

(30) Foreign Application Priority Data

May 1, 2008 (JP) .................................. 2008-119835

(51) Int. Cl.
*H01L 21/00* (2006.01)

(52) U.S. Cl. ............ 438/42; 438/97; 438/458; 438/693; 438/745; 257/E21.211; 257/E21.239; 257/E29.002; 257/E29.089

(58) Field of Classification Search .................... 438/42, 438/97, 458, 693, 745; 257/E21.211, 239, 257/29.002, 89
See application file for complete search history.

(56) References Cited

U.S. PATENT DOCUMENTS

| 6,399,500 | B1 | 6/2002 | Porowski et al. | |
|---|---|---|---|---|
| 7,416,604 | B2 * | 8/2008 | Ishibashi et al. | 117/89 |
| 7,662,239 | B2 * | 2/2010 | Ishibashi et al. | 148/33 |
| 2007/0254401 | A1 * | 11/2007 | Nishiura et al. | 438/97 |
| 2008/0012025 | A1 * | 1/2008 | Matsuoka et al. | 257/77 |
| 2008/0057608 | A1 * | 3/2008 | Ishibashi et al. | 438/42 |
| 2010/0210089 | A1 * | 8/2010 | Kasai et al. | 438/458 |
| 2010/0224963 | A1 * | 9/2010 | Ishibashi et al. | 257/615 |

FOREIGN PATENT DOCUMENTS

| JP | 2003-165799 | 6/2003 |
|---|---|---|
| JP | 2003-183100 | 7/2003 |

* cited by examiner

*Primary Examiner* — Michael S Lebentritt
(74) *Attorney, Agent, or Firm* — Drinker Biddle & Reath LLP

(57) ABSTRACT

A method for surface treatment of a group III nitride crystal includes the steps of lapping a surface of a group III nitride crystal using a hard abrasive grain with a Mohs hardness higher than 7, and abrasive-grain-free polishing the lapped surface of the group III nitride crystal using a polishing solution without containing abrasive grain, and the polishing solution without containing abrasive grain has a pH of not less than 1 and not more than 6, or not less than 8.5 and not more than 14. Accordingly, the method for surface treatment of a group III nitride crystal can be provided according to which hard abrasive grains remaining at the lapped crystal can be removed to reduce impurities at the crystal surface.

13 Claims, 5 Drawing Sheets

GROUP III NITRIDE CRYSTAL AND METHOD FOR SURFACE TREATMENT THEREOF, GROUP III NITRIDE STACK AND MANUFACTURING METHOD THEREOF, AND GROUP III NITRIDE SEMICONDUCTOR DEVICE AND MANUFACTURING METHOD THEREOF

BACKGROUND OF THE INVENTION

1. Field of the Invention

The present invention relates to a method for surface treatment of a group III nitride crystal that is suitably used, for example, as a material for a substrate of a semiconductor device.

2. Description of the Background Art

The surface of a grown group III nitride crystal to be used for example as a material for a substrate of a semiconductor device is preferably treated so that the surface is as flat as possible and as low as possible in impurity concentration. U.S. Pat. No. 6,399,500 accordingly discloses that the surface of a $Ga_{1-X-Y}Al_XIn_YN$ crystal is polished with a basic polishing solution that does not contain abrasive grains and thereafter polished with pure water.

The group III nitride crystal, however, is chemically stable and thus the polishing efficiency is still low when polished with the basic polishing solution without containing abrasive grains as described above.

SUMMARY OF THE INVENTION

In order to efficiently treat the surface of the chemically stable group III nitride crystal, it is therefore necessary to perform lapping or polishing with abrasive grains. In particular, the group III nitride crystal is preferably lapped with hard abrasive grains having a Mohs hardness higher than that of the group III nitride crystal, for example, a Mohs hardness higher than 7.

When the group III nitride crystal is lapped, however, the hard abrasive grains bite the surface of the crystal to mechanically remove the surface layer. Thus, some hard abrasive grains caught in the surface of the crystal remain after the lapping. Since the group III nitride crystal is chemically stable, the surface of the crystal is not effectively etched with a chemical solution. Thus, washing with a chemical solution cannot sufficiently remove the hard abrasive grains remaining at the crystal surface. A resultant problem is the contamination due to the abrasive grains remaining at the crystal surface, in a post-process such as formation of an epitaxial layer on the crystal.

An object of the present invention is therefore to provide a method for surface treatment of a group III nitride crystal according to which hard abrasive grains remaining at the crystal surface after lapped can be removed to reduce impurities at the crystal surface.

Here, the lapping may be followed by polishing with soft abrasive grains having a Mohs hardness of 7 or less to remove the hard abrasive grains remaining at the crystal surface after lapped. Soft abrasive grains, however, remain at the crystal surface after polished with soft abrasive grains. Further, regarding a group III nitride crystal including a high dislocation density region and a low dislocation density region, there is a problem that the high dislocation density region and its peripheral region are removed to a relatively larger extent, so that the outermost or edge region has an outwardly and downwardly sloping shape to reduce the effective area.

Another object of the present invention is therefore to provide a method for surface treatment of a group III nitride crystal, according to which, when polishing with soft abrasive grains is performed after lapping, excessive removal of the surface in a high dislocation density region and its peripheral region can be restrained to prevent the outermost or edge region from having an outwardly and downwardly sloping shape, and soft abrasive grains remaining at the crystal surface can be removed to reduce impurities at the crystal surface.

The present invention is a method for surface treatment of a group III nitride crystal, including the steps of: lapping a surface of a group III nitride crystal using a hard abrasive grain with a Mohs hardness higher than 7; and abrasive-grain-free polishing for polishing the lapped surface of the group III nitride crystal using a polishing solution without containing abrasive grain, and the polishing solution without containing abrasive grain has a pH of not less than 1 and not more than 6, or not less than 8.5 and not more than 14.

Regarding the method for surface treatment of a group III nitride crystal according to the present invention, in the step of abrasive-grain-free polishing, polishing may be performed using a polishing pad with a compressibility of not less than 1.5% and not more than 20% and at a polishing pressure of not less than 0.98 kPa (10 $gf/cm^2$) and not more than 58.8 kPa (600 $gf/cm^2$).

The method for surface treatment of a group III nitride crystal according to the present invention may further include the step of soft abrasive grain polishing for polishing the lapped surface of the group III nitride crystal using a polishing solution containing a soft abrasive grain with a Mohs hardness of not more than 7, after the step of lapping and before the step of abrasive-grain-free polishing. In the step of soft abrasive grain polishing, polishing may be performed using a polishing pad with a compressibility of not less than 0.8% and not more than 5% and at a polishing pressure of not less than 4.9 kPa (50 $gf/cm^2$) and not more than 98 kPa (1000 $gf/cm^2$).

Further, the present invention is a group III nitride crystal produced through the surface treatment as described above. Through the above-described surface treatment, surface roughness Ra of the group III nitride crystal may be made not more than 2 nm. A work-affected layer may have a thickness of not more than 50 nm. The group III nitride crystal may include a low dislocation density region and a high dislocation density region, and a difference in level between a surface of the low dislocation density region and a surface of the high dislocation density region may be not more than 3 μm. Here, in the group III nitride crystal including the low dislocation density region and the high dislocation density region, a flat surface region of the low dislocation density region may have an area of not less than 40% of the whole surface of the low dislocation density region.

Further, the present invention is a group III nitride stack including the group III nitride crystal as described above and at least one group III nitride layer epitaxially grown on a surface of the group III nitride crystal. Further, the present invention is a method for manufacturing a group III nitride stack using the group III nitride crystal as described above, and the method includes the steps of: preparing the group III nitride crystal; and epitaxially growing at least one group III nitride layer on a surface of the group III nitride crystal.

Further, the present invention is a group III nitride semiconductor device including: the group III nitride crystal as described above; at least one group III nitride layer epitaxially grown on a surface of the group III nitride crystal; and an electrode formed on at least one of a surface of an outermost layer of the group III nitride layer and a surface of the group III nitride crystal. Further, the present invention is a method for manufacturing a group III nitride semiconductor device using the group III nitride crystal as described above, and the method includes the steps of: preparing the group III nitride crystal; epitaxially growing at least one group III nitride layer on a surface of the group III nitride crystal; and forming an electrode on at least one of a surface of an outermost layer of the group III nitride layer and a surface of the group III nitride crystal.

In accordance with the present invention, a method for surface treatment of a group III nitride crystal can be provided according to which hard abrasive grains remaining at the crystal surface after lapped are removed by abrasive-grain-free polishing so that impurities at the crystal surface can be reduced. A method for surface treatment of a group III nitride crystal can also be provided according to which the crystal surface is lapped and thereafter polished with soft abrasive grains. Hard abrasive grains remaining at the crystal surface after lapped are removed by the soft abrasive grain polishing and soft abrasive grains remaining at the crystal surface after polished with soft abrasive grains are further removed, so that impurities at the crystal surface can be reduced.

"Polishing solution" of the present invention includes those containing abrasive grains as well as those without containing abrasive grains.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
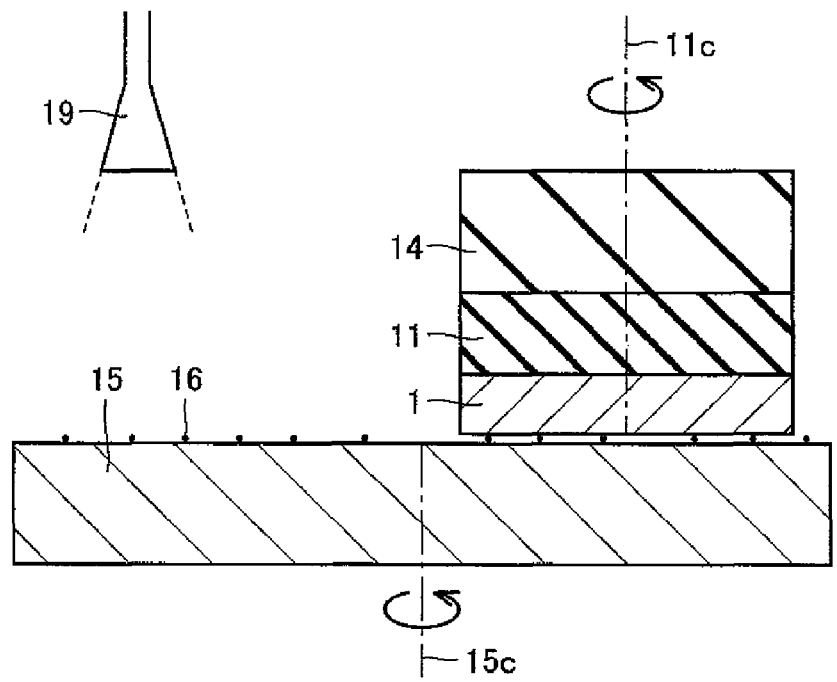
FIG. 1 is a schematic cross section showing a lapping step in a method for surface treatment of a group III nitride crystal according to the present invention.
Figure 2:
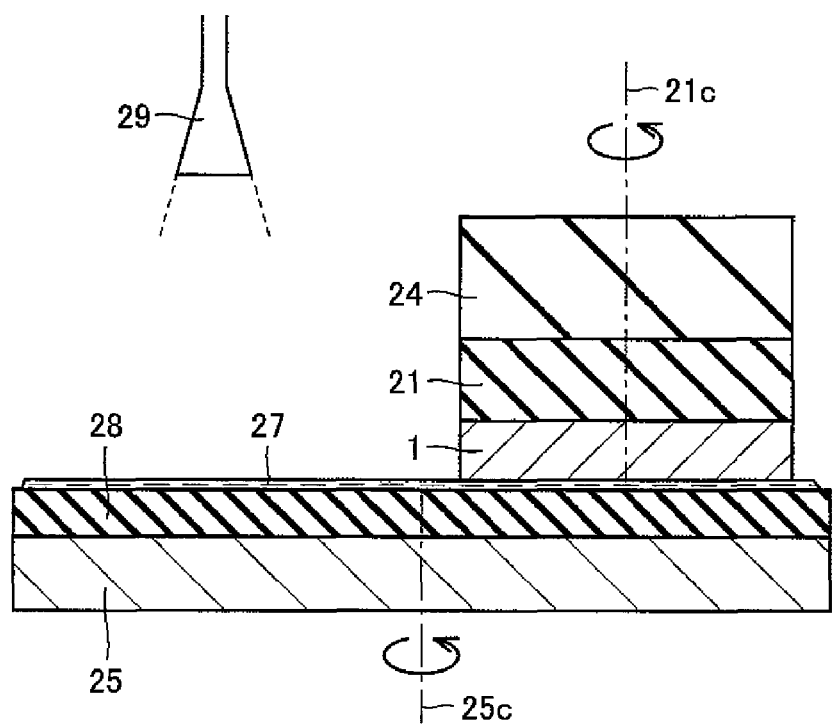
FIG. 2 is a schematic cross section showing an abrasive-grain-free polishing step in a method for surface treatment of a group III nitride crystal according to the present invention.

Referring to FIGS. 1 and 2, an embodiment of a method for surface treatment of a group III nitride crystal of the present invention includes the step of lapping a surface of a group III nitride crystal 1 using hard abrasive grains 16 with a Mohs hardness higher than 7, and the abrasive-grain-free polishing step for polishing the lapped surface of group III nitride crystal 1 using a polishing solution 27 that does not contain abrasive grains, and polishing solution 27 without containing abrasive grains has a pH of not less than 1 and not more than 6, or not less than 8.5 and not more than 14. The method for surface treatment of a group III nitride crystal in the present embodiment can remove hard abrasive grains remaining at the crystal surface after the lapping step using hard abrasive grains, so as to reduce impurities at the crystal surface, by means of the abrasive-grain-free polishing step using the polishing solution without containing abrasive grains and having a pH of not less than 1 and not more than 6, or not less than 8.5 and not more than 14.

Referring to FIG. 1, the method for surface treatment of a group III nitride crystal in the present embodiment thus includes the step of lapping a surface of group III nitride crystal 1 using hard abrasive grains 16 with a Mohs hardness higher than 7. This lapping step can be used to efficiently lap the surface of the group III nitride crystal.

The lapping step in the present embodiment refers to the step of mechanically smoothing the surface of group III nitride crystal 1 using hard abrasive grains 16 with a Mohs hardness higher than 7. For example, with reference to FIG. 1, the surface of group III nitride crystal 1 can be lapped by rotating a surface plate 15 about a rotational axis 15c while feeding hard abrasive grains 16 from an abrasive grain feed port 19 onto surface plate 15, and rotating about a rotational axis 11c a crystal holder 11 to which group III nitride crystal 1 is secured and on which a weight 14 is placed while pressing group III nitride crystal 1 against surface plate 15 fed with hard abrasive grains 16.

Surface plate 15 is not particularly limited to a specific one as long as surface plate 15 can be used to smoothly perform the lapping. Preferably, a surface plate containing at least one of metallic materials such as Sn (tin), Sn—Bi (tin-bismuth) alloy, Sn—Sb (tin-antimony) alloy, Sn—Pb (tin-lead) alloy, Cu (copper), inorganic materials such as $Al_2O_3$ (aluminum oxide), $SiO_2$ (silicon dioxide), $CeO_2$ (cerium oxide), and organic materials such as phenol resin, urethane resin, amide resin, imide resin, or a surface plate containing any combination of them is used. Further, a pad (not shown) may be secured on surface plate 15 and hard abrasive grains 16 may be scattered on the pad to perform the lapping in a similar manner to the above-described one.

Hard abrasive grains 16 are not particularly limited to a specific one as long as hard abrasive grains 16 have a Mohs hardness higher than 7. Abrasive grains containing a material such as diamond, SiC, BN, $Si_3N_4$, $Al_2O_3$, $Cr_2O_3$, $ZrO_2$ are preferably used. The type and size of these abrasive grains are selected in consideration of the mechanical lapping function of the abrasive grains. In order to increase the lapping speed, abrasive grains of high hardness and large size are used. In order to decrease surface roughness Ra and surface roughness Ry so as to smooth the surface and/or make a work-affected layer smaller, abrasive grains of low hardness and small size are used. In order to shorten the polishing time and obtain a smooth surface, a multi-step lapping from the step using abrasive grains of larger size to the step using abrasive grains of smaller size is performed.

Here, surface roughness Ra refers to a value determined in the following way. A reference area is sampled. In the sampled area, the distance from a mean plane to a point on a roughness profile (absolute value of the deviation) is measured. The sum of the measured distances is calculated. The average distance in the reference area is surface roughness Ra. Surface roughness Ry is determined in the following way. A reference area is sampled. In the sampled area, the sum of the height from a mean plane to the highest peak of a roughness profile and the depth from the mean plane to the lowest valley of the roughness profile is surface roughness Ry. Surface roughness Ra and surface roughness Ry can be identified through observation by means of an AFM (Atomic Force Microscope). Further, the work-affected layer refers to a layer in which a crystal lattice formed in the surface side region of the crystal is disordered due to grinding or polishing of the crystal surface. The presence and the thickness of the work-affected layer can be identified through observation by means of a TEM (Transmission Electron Microscope) or CL (cathode luminescence).

In order to mechanically smooth the surface of group III nitride crystal 1, grinding may be used instead of the lapping. For the grinding, a grindstone containing hard abrasive grains fixed by a binder is used. The grinding can remove the surface of a group III nitride crystal to smooth the surface faster than the lapping.

Referring to FIG. 2, the method for surface treatment of the group III nitride crystal in the present embodiment includes the abrasive-grain-free polishing step for polishing the lapped surface of group III nitride crystal 1 using polishing solution 27 without containing abrasive grains. The abrasive-grain-free polishing step can be used to remove hard abrasive grains remaining at the crystal surface to reduce impurities at the crystal surface.

The abrasive-grain-free polishing step of the present embodiment refers to the step of chemically smoothing the surface of group III nitride crystal 1 using a polishing solution without containing abrasive grains. For example, referring to FIG. 2, a polishing pad 28 secured on a surface plate 25 is rotated about a rotational axis 25c while polishing solution 27 that does not contain abrasive grains is fed onto polishing pad 28 from a polishing solution feed port 29, and a crystal holder 21 on which group III nitride crystal 1 is secured and on which a weight 24 is placed is rotated about its rotational axis 21c while group III nitride crystal 1 is pressed against polishing pad 28. In this way, impurities such as abrasive grains remaining at the surface of group III nitride crystal 1 can be efficiently removed.

Here, surface plate 25 is not particularly limited to a specific one as long as surface plate 25 can be used to smoothly perform the abrasive-grain-free polishing. Preferably, a surface plate containing at least one of metallic materials such as stainless, aluminum (Al), inorganic materials such as aluminum oxide ($Al_2O_3$), magnesium oxide (MgO), aluminum nitride (AlN), silicon carbide (SiC), and organic materials such as phenol resin, urethane resin, amide resin, imide resin, or a surface plate containing any combination of them is used.

The polishing solution without containing abrasive grains used in the abrasive-grain-free polishing step has a pH of not less than 1 and not more than 6 or a pH of not less than 8.5 and not more than 14. In the case where pH is lower than 1 or higher than 14, surface roughness Ra and surface roughness Ry of the crystal are larger. In the case where pH is higher than 6.5 and lower than 8.5, the effect of removing impurities from the crystal surface is insufficient. For a similar reason, pH is more preferably not less than 2 and not more than 4, or not less than 10 and not more than 12.

Here, for adjusting the pH of the polishing solution without containing abrasive grains, an inorganic acid such as hydrochloric acid, nitric acid, sulfuric acid, phosphoric acid, an organic acid such as formic acid, acetic acid, citric acid, malic acid, tartaric acid, succinic acid, phthalic acid, maleic acid, fumaric acid, an inorganic alkali such as KOH, NaOH, an organic alkali such as $NH_4OH$, amine, an inorganic salt such as sulfate, nitrate, phosphate, and an organic salt such as citrate, malate, may be used. Of these pH adjusters, the organic acid and the organic alkali that do not contain a metal element are more preferable rather than the inorganic acid and the inorganic alkali for enhancing the effect of removing impurities from the crystal surface. Of the organic acids, a polycarboxylic acid containing two or more carboxyl groups is preferred. Further, an oxidizer described below may be added to adjust the pH as well.

Preferably, the polishing solution without containing abrasive grains contains an oxidizer. The polishing solution without containing abrasive grains has an increased ORP (oxidation-reduction potential) by containing an oxidizer, so that the effect of removing impurities such as abrasive grains remaining at the crystal surface is enhanced. While the oxidizer is not particularly limited to a specific one, it is preferable to use, for increasing the ORP, any of hypochlorous acid, chlorinated isocyanuric acid such as trichloroisocyanuric acid, chlorinated isocyanurate such as sodium dichloroisocyanurate, permanganate such as potassium permanganate, dichromate such as potassium dichromate, bromate such as potassium bromate, thiosulfate such as sodium thiosulfate, persulfate such as ammonium persulfate and potassium persulfate, nitric acid, hydrogen peroxide solution, and ozon for example.

In order to enhance the effect of removing impurities such as abrasive grains remaining at the crystal surface, it is preferable that the polishing solution without containing abrasive grains satisfies the following relation between pH value x and ORP value y (mV). Specifically, under the acid condition $1 \leqq x \leqq 6$, the relation $$-50x+1000<y<-50x+1800 \quad (1)$$

is preferably satisfied and, under the alkaline condition $8.5 \leqq x \leqq 14$, the relation $$-50x+800<y<-50x+1500 \quad (2)$$

is preferably satisfied.

In order to enhance the effect of removing impurities, a surface active agent may be further added to the polishing solution without containing abrasive grains. The surface active agent to be added to the polishing solution without containing abrasive grains is not particularly limited to a specific one. Anionic agent, cationic agent or nonionic agent may be used as the surface active agent. Anionic or cationic surface active agent, however, is preferably used because it has a high impurity removal effect.

Here, the group III nitride crystal is grown by any of various gas phase methods such as HVPE (hydride vapor phase epitaxy), sublimation, and various liquid phase methods such as solution method (including flux method). For growth of the group III nitride crystal, in order to decrease the dislocation density in the crystal, a mask layer of $SiO_2$ for example that has an opening may be formed on an underlying substrate and a group III nitride crystal may be facet-grown on the mask (see for example Japanese Patent Laying-Open Nos. 2003-165799 and 2003-183100).

Figure 4A:
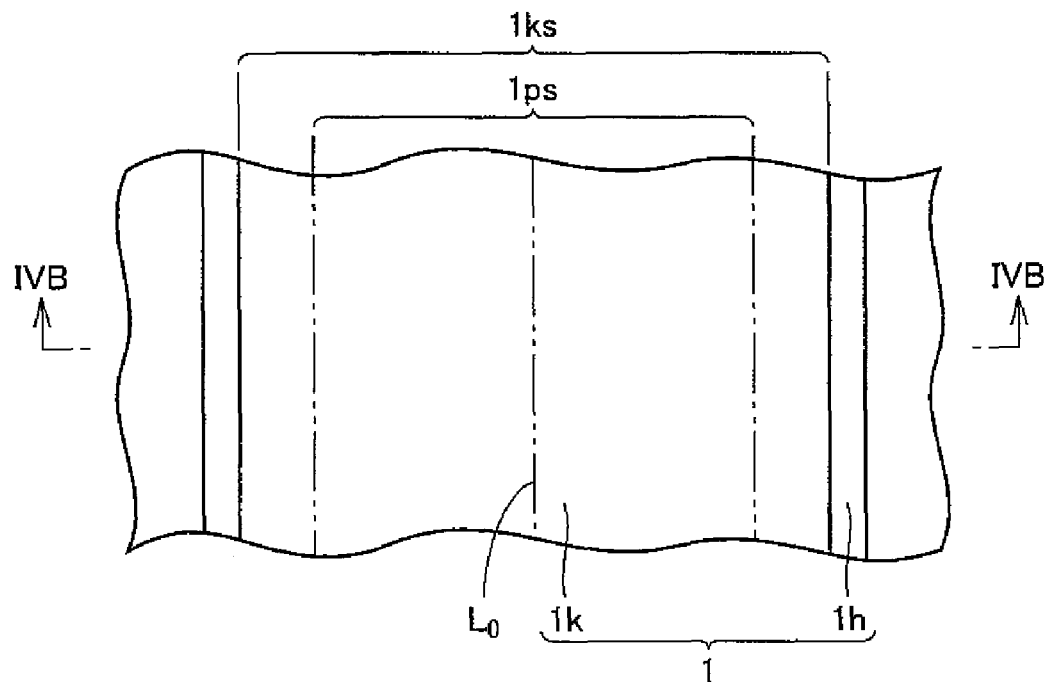
FIG. 4A is a schematic plan view showing a group III nitride crystal including a high dislocation density region and a low dislocation density region after the soft abrasive grain polishing step.
Figure 4B:
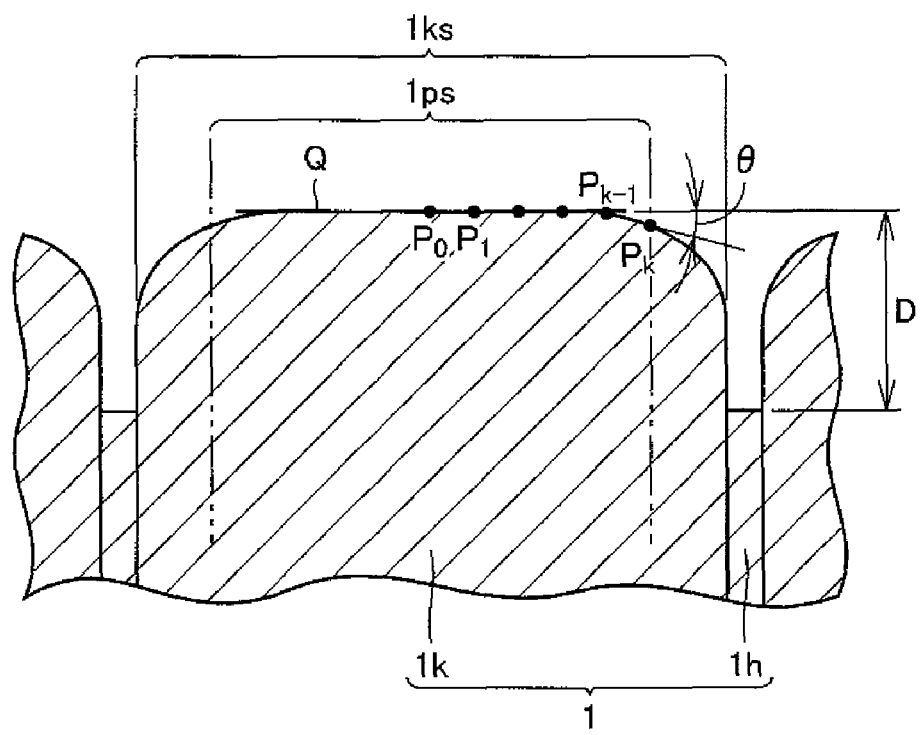
FIG. 4B is a schematic cross section showing the group III nitride crystal including the high dislocation density region and the low dislocation density region after the soft abrasive grain polishing step.

Referring to FIGS. 4A and 4B, group III nitride crystal 1 that is facet-grown as described above includes a high dislocation density region 1h where dislocations in the crystal concentrate and a low dislocation density region 1k where the number of dislocations is smaller. Here, the group III nitride crystal including high dislocation density region 1h and low dislocation density region 1k has, for example, a structure where high dislocation density regions are arranged like stripes with respect to low dislocation density regions (stripe structure, see FIGS. 4A and 4B) or a structure where high dislocation density regions are arranged like dots with respect to the low dislocation density regions (dot structure, not shown). High dislocation density region 1*h* and low dislocation density region 1*k* in group III nitride crystal 1 can be observed by means of CL (S-4300 manufactured by Hitachi Corporation) for example.

In the facet-grown group III nitride crystal as described above, the surface of low dislocation density region 1*k* is a Ga atomic surface, while the surface of high dislocation density region 1*h* is an N atomic surface. Therefore, the surface of high dislocation density region 1*h* is chemically polished at a higher rate than the surface of low dislocation density region 1*k*. Therefore, referring to FIGS. 4A and 4B, if the surface of group III nitride crystal 1 including high dislocation density region 1*h* and low dislocation density region 1*k* is treated by chemical polishing such as abrasive-grain-free polishing, the surface of high dislocation density region 1*h* depresses relative to the surface of low dislocation density region 1*k*.

Accordingly, it is preferable to use, in the abrasive-grain-free polishing step in the present embodiment, polishing pad 28 having a compressibility of not less than 1.5% and not more than 20%. If the compressibility of polishing pad 28 is lower than 1.5%, surface roughness Ra and surface roughness Ry of the crystal after polished without abrasive grains are larger. If the compressibility of polishing pad 28 is higher than 20%, the effect of removing impurities is lessened, the depth of the depression of the surface of high dislocation density region 1*h* of the group III nitride crystal is larger and a flat surface region 1*ps* of the surface of low dislocation density region 1*k* is smaller. In view of this, the compressibility of the polishing pad used in the abrasive-grain-free polishing step is preferably not less than 3% and not more than 10%.

In view of this, it is preferable that polishing pad 28 is made of polyurethane or the like and has the form of suede, nonwoven fabric, elastomer, foam or the like.

The compressibility of the polishing pad in the present application is defined by the following expression:

$$\text{compressibility } (\%) = (T_1 - T_2)/T_2 \times 100 \quad (A)$$

where $T_1$ is the thickness of the pad after one minute from the time when the pad is loaded with initial load $W_1$, and $T_2$ is the thickness of the pad after one minute from the time when the load on the pad is increased to $W_2$. Here, for the calculation of the compressibility, initial load $W_1$ of 100 g and load $W_2$ of 1600 g are used.

Preferably, the polishing pressure in the abrasive-grain-free polishing step is not less than 0.98 kPa (10 gf/cm$^2$) and not more than 58.8 kPa (600 gf/cm$^2$). If the polishing pressure is lower than 0.98 kPa (10 gf/cm$^2$), the effect of removing impurities such as hard abrasive grains remaining at the crystal surface is smaller and the effect of smoothing the whole crystal surface is also smaller. If the polishing pressure is higher than 58.8 kPa (600 gf/cm$^2$), surface roughness Ra and surface roughness Ry of the crystal are larger and flat surface region 1*ps* of the surface of low dislocation density region 1*k* is smaller. In view of this, the polishing pressure in the abrasive-grain-free polishing step is more preferably not less than 4.9 kPa (50 gf/cm$^2$) and not more than 39.2 kPa (400 gf/cm$^2$).

In order to further remove hard abrasive grains, a water cleaning step may be performed after the above-described abrasive-grain-free polishing step. The cleaning method is not particularly limited to a specific one, and ultrasonic cleaning, scrub cleaning or the like may be used. In order to enhance the effect of removing hard abrasive grains, scrub cleaning is preferred. The scrub cleaning is preferably performed before the crystal surface dries after polished. The scrub cleaning can effectively remove not only impurities of the main surface of the crystal but also impurities of the side surface thereof.

For the surface of group III nitride crystal 1 that has been ground using a grindstone containing hard abrasive grains fixed by a binder as well, the surface can be polished using polishing solution 27 without containing abrasive grains. This abrasive grain-free polishing step can be used to remove hard abrasive grains remaining at the crystal surface to reduce impurities at the crystal surface.

Second Embodiment

Figure 3:
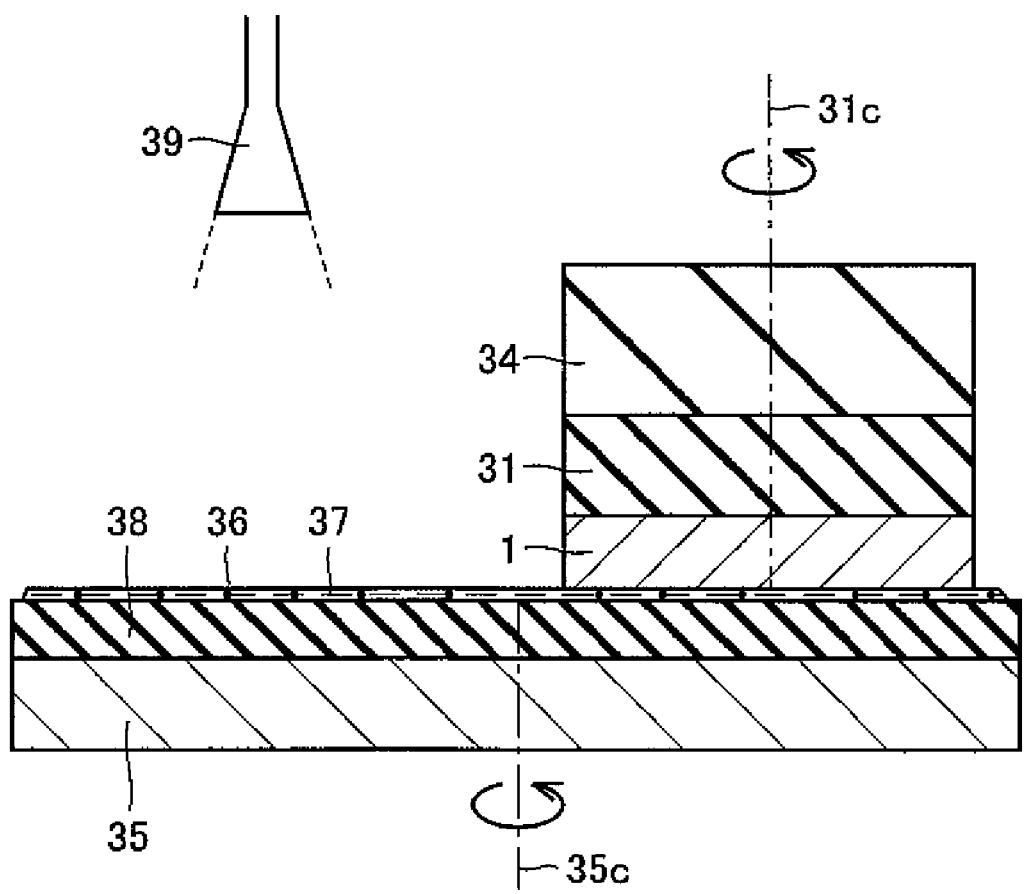
FIG. 3 is a schematic cross section showing a soft abrasive grain polishing step in a method for surface treatment of a group III nitride crystal according to the present invention.

Referring to FIGS. 1 to 3, another embodiment of the method for surface treatment of a group III nitride crystal of the present invention further includes a soft abrasive grain polishing step (FIG. 3), after the lapping step (FIG. 1) and before the abrasive-grain-free polishing step (FIG. 2) of the surface treatment method in the first embodiment, for polishing the lapped surface using a polishing solution 37 containing soft abrasive grains 36 with a Mohs hardness of not more than 7. The soft abrasive grain polishing step can be used to remove hard abrasive grains remaining at the crystal surface. Further, soft abrasive grains remaining at the crystal surface due to the soft abrasive grain polishing step are removed by the subsequent abrasive-grain-free polishing step.

Namely, the method for surface treatment of a group III nitride crystal in the present embodiment includes the step of lapping a surface of a group III nitride crystal using hard abrasive grains with a Mohs hardness higher than 7 (FIG. 1), the soft abrasive grain polishing step of polishing the lapped surface of the group III nitride crystal using polishing solution 37 containing soft abrasive grains 36 with a Mohs hardness of not more than 7 (FIG. 3), and the abrasive-grain-free polishing step of polishing the soft-abrasive-grain-polished surface of the group III nitride crystal using a polishing solution containing no abrasive grain and having a pH of not less than 1 and not more than 6 or a pH of not less than 8.5 and not more than 14 (FIG. 2).

The lapping step of the present embodiment is similar to the lapping step of the first embodiment.

The soft abrasive grain polishing step of the present embodiment refers to the step of chemically and mechanically smoothing the surface of group III nitride crystal 1. For example, referring to FIG. 3, a polishing pad 38 secured on a surface plate 35 is rotated about a rotational axis 35*c* while polishing solution 37 containing soft abrasive grains 36 is supplied from a polishing solution feed port 39 onto polishing pad 38, and a crystal holder 31 to which group III nitride crystal 1 is secured and on which a weight 34 is placed is rotated about its rotational axis 31*c* while group III nitride crystal 1 is pressed against polishing pad 38. In this way, the surface of group III nitride crystal 1 can be chemically and mechanically polished. The soft abrasive grain polishing step can be used to remove hard abrasive grains remaining at the crystal surface.

Here, surface plate 35 is not particularly limited to a specific one as long as surface plate 35 can be used to smoothly perform the soft abrasive grain polishing. Preferably, a surface plate containing at least one of inorganic materials such as stainless, aluminum (Al), aluminum oxide ($Al_2O_3$), magnesium oxide (MgO), aluminum nitride (AlN), silicon carbide (SiC), and organic materials such as phenol resin, urethane resin, amide resin, imide resin, or a surface plate containing any combination of them is used.

The soft abrasive grains used for the soft abrasive grain polishing step are not particularly limited to a specific one as long as the abrasive grains have a Mohs hardness of not more than 7. Preferably, abrasive grains containing a material such as $ZrO_2$, $SiO_2$, $CeO_2$, $MnO_2$, $Fe_2O_3$, $Fe_3O_4$, NiO, ZnO, CoO, $Co_3O_4$, $GeO_2$, $Ga_2O_3$, $In_2O_3$ are used. In order to promote removal of soft abrasive grains in the subsequent abrasive-grain-free polishing step, a metallic element for the soft abrasive grains having a higher ionization tendency is preferred. Further, in order to promote removal of soft abrasive grains as well in the subsequent cleaning step as described below, a metallic element for the soft abrasive grains having a higher ionization tendency than H (hydrogen) is preferred.

Polishing solution 37 containing soft abrasive grains 36 is not particularly limited to a specific one. In order to enhance the effect of removing impurities such as hard abrasive grains remaining at the crystal surface, the polishing solution preferably has a pH comparable to that of the polishing solution without containing abrasive grains. Specifically, the pH of polishing solution 37 containing soft abrasive grains 36 is preferably not less than 1 and not more than 6 or not less than 8.5 and not more than 14, and more preferably not less than 2 and not more than 4 or not less than 10 and not more than 12. For adjustment of the pH of the polishing solution containing soft abrasive grains, the inorganic acids, organic acids, inorganic alkalis, organic alkalis, inorganic salts, organic salts and oxidizers similar to those for the polishing solution without containing abrasive grains may be used. In order to enhance the effect of removing impurities at the crystal surface, the organic acids and organic alkalis without containing metallic element are more preferable than the inorganic acids and inorganic salts, among these pH adjusters. Further, of the organic acids, polycarboxylic acid containing two or more carboxyl groups is preferred.

In order to enhance the effect of removing impurities such as hard abrasive grains remaining at the crystal surface, it is preferable that the polishing solution containing soft abrasive grains, like the polishing solution without containing abrasive grains, satisfies the following relation between pH value x and ORP value y (mV). Specifically, under the acid condition $1 \leq x \leq 6$, the relation:

$$-50x+1000<y<-50x+1800 \quad (3)$$

is preferably satisfied and, under the alkaline condition $8.5 \leq x \leq 14$, the relation $$-50x+800<y<-50x+1500 \quad (4)$$

is preferably satisfied.

The group III nitride crystal is grown by any of various gas phase methods such as HVPE (hydride vapor phase epitaxy), sublimation, and various liquid phase methods such as solution method (including flux method). For growth of the group III nitride crystal, in order to decrease the dislocation density in the crystal, a mask layer of $SiO_2$ for example that has an opening may be formed on an underlying substrate and the group III nitride crystal may be facet-grown on the mask layer (see for example Japanese Patent Laying-Open Nos. 2003-165799 and 2003-183100). Referring to FIGS. 4A and 4B, group III nitride crystal 1 that is facet-grown as described above includes a high dislocation density region 1h where dislocations in the crystal concentrate and a low dislocation density region 1k where the number of dislocations is smaller. Here, the group III nitride crystal including high dislocation density region 1h and low dislocation density region 1k has, for example, a structure where high dislocation density regions are arranged like stripes with respect to low dislocation density regions (stripe structure, see FIGS. 4A and 4B) or a structure where high dislocation density regions are arranged like dots with respect to the low dislocation density regions (dot structure, not shown). High dislocation density region 1h and low dislocation density region 1k in group III nitride crystal 1 can be observed by means of CL (S-4300 manufactured by Hitachi Corporation) for example.

In the facet-grown group III nitride crystal as described above, the surface of low dislocation density region 1k is a Ga atomic surface, while the surface of high dislocation density region 1h is an N atomic surface. Therefore, the surface of high dislocation density region 1h is chemically and mechanically polished at a higher rate than the surface of low dislocation density region 1k. Therefore, referring to FIGS. 4A and 4B, if the surface of group III nitride crystal 1 including high dislocation density region 1h and low dislocation density region 1k is treated by chemical mechanical polishing such as polishing with a polishing solution containing soft abrasive grains, the surface of high dislocation density region 1h depresses relative to the surface of low dislocation density region 1k.

Accordingly, it is preferable that, in the step of polishing with soft abrasive grains in the present embodiment, polishing is performed with a polishing pad 38 having a compressibility of not less than 0.8% and not more than 5% and at a polishing pressure of not less than 4.9 kPa (50 $gf/cm^2$) and not more than 98 kPa (1000 $gf/cm^2$). In view of this, it is preferable that polishing pad 38 is made of polyurethane or the like and has the form of suede, non-woven fabric, elastomer, foam or the like.

If the compressibility of polishing pad 38 is lower than 0.8%, surface roughness Ra and surface roughness Ry of the crystal after polished with soft abrasive grains are larger. If the compressibility of polishing pad 38 is higher than 5%, the depth of the depression of the surface of high dislocation density region 1h of the group III nitride crystal is larger, and a flat surface region 1ps of the surface of low dislocation density region 1k is smaller. In view of this, the compressibility of polishing pad 38 is preferably not less than 1% and not more than 3%.

If the polishing pressure is lower than 4.9 kPa (50 $gf/cm^2$), the effect of removing impurities such as hard abrasive grains remaining at the crystal surface is smaller and the effect of smoothing the whole crystal surface is also smaller. If the polishing pressure is higher than 98.1 kPa (1000 $gf/cm^2$), surface roughness Ra and surface roughness Ry of the crystal are larger, the depth of the depression of the surface of the high dislocation density region is larger and flat surface region 1ps of the surface of low dislocation density region 1k is smaller. In view of this, preferably the polishing pressure is not less than 9.8 kPa (100 $gf/cm^2$) and not more than 68.6 kPa (700 $gf/cm^2$).

The abrasive-grain-free polishing step of the present embodiment is similar to the abrasive-grain-free polishing step of the first embodiment except that the surface of the group III nitride crystal having been polished with soft abrasive grains is polished instead of the lapped surface of the group III nitride crystal. Through this abrasive-grain-free polishing step, impurities such as soft abrasive grains remaining at the crystal surface are removed.

In order to further remove soft abrasive grains, the abrasive-grain-free polishing step may be followed by the water cleaning step. The method for cleaning is not particularly limited to a specific one, and ultrasonic cleaning, scrub cleaning for example may be used. In order to enhance the effect of removing soft abrasive grains, scrub cleaning is preferred. The scrub cleaning is preferably performed before the surface of the crystal dries after being polished. The scrub cleaning can effectively remove not only the impurities of the main surface of the crystal but also the impurities of the side surface thereof.

Third Embodiment

Referring to FIG. 2, an embodiment of the group III nitride crystal of the present invention relates to group III nitride crystal 1 obtained through the surface treatment of the first embodiment or second embodiment. Since the group III nitride crystal of the present embodiment is surface-treated according to the first embodiment or second embodiment, impurities such as hard abrasive grains and soft abrasive grains remaining at the crystal surface are removed. Therefore, one or more group III nitride layers can be epitaxially grown on the surface of the group III nitride crystal of the present embodiment to produce a semiconductor device having excellent characteristics with high yield.

In order to produce a semiconductor device having excellent characteristics with high yield by epitaxially growing one or more group III nitride layers on the surface of group III nitride crystal 1 of the present embodiment, surface roughness Ra is preferably not more than 2 nm and more preferably not more than 1 nm. For like purpose, surface roughness Ry is preferably not more than 20 nm and more preferably not more than 10 nm. Further, for like purpose, the thickness of a work-affected layer of the group III nitride crystal is preferably not more than 50 nm and more preferably not more than 30 nm.

The group III nitride crystal of the present embodiment may be a crystal where the dislocation density in the crystal surface is uniform, or may be a crystal where the dislocation density in the crystal surface is not uniform. An example of the crystal where the dislocation density in the crystal surface is not uniform is the crystal as shown in FIGS. 4A and 4B including low dislocation density region $1k$ and high dislocation density region $1h$.

Referring to FIGS. 4A and 4B, it is preferable that, in the group III nitride crystal of the present embodiment, level difference D between the surface of low dislocation density region $1k$ and that of high dislocation density region $1h$ is not more than 3 µm. One or more group III nitride layers can be epitaxially grown on the surface of group III nitride crystal 1 where level difference D between the surface of low dislocation density region $1k$ and that of high dislocation density region $1h$ is not more than 3 µm to produce a semiconductor device having excellent characteristics with high yield.

Further, referring to FIGS. 4A and 4B, it is preferable that, in the group III nitride crystal of the present embodiment, flat surface region $1ps$ of low dislocation density region $1k$ has an area of at least 40% relative to the whole surface $1ks$ of low dislocation density region $1k$. Here, flat surface region $1ps$ of low dislocation density region $1k$ is defined as follows. From the uppermost point $P_0$ or uppermost line $L_0$ of the surface of low dislocation density region $1k$ toward the outer periphery of the low dislocation density region, points $P_1, P_2, \ldots, P_{k-1}$, $P_k$ are plotted at regular intervals of 10 µm (where k is a positive integer). The angle of inclination θ refers to the angle formed between the straight line including points $P_{k-1}$ and $P_k$ and a reference plane Q abutting on the surface (a curved surface close to flat surface) of low dislocation density region $1k$ at uppermost point $P_0$ or uppermost line $L_0$. Then, the flat surface region is defined as a surface region where arbitrary points $P_k$ having an angle of inclination θ of less than 0.1° are present. This flat surface region $1ps$ continues from the central portion of the surface of low dislocation density region $1k$ toward the outer periphery. Since high dislocation density region $1h$ is more likely to be removed in the polishing step, the outer peripheral portion of low dislocation density region $1k$ that is located near high dislocation density region $1h$ is removed first relative to the central portion of low dislocation density region $1k$, so that the outermost or edge region has an outwardly and downwardly sloping shape. Consequently, inclination angle θ as described above is larger and a region where the angle is 0.1° or more is generated. It is further supposed here that the ratio (percentage) of the area of flat surface region $1ps$ in low dislocation density region $1k$ with respect to the area of the whole surface $1ks$ in low dislocation density region $1k$ is defined as flat surface region ratio (%).

On the surface of the group III nitride crystal where flat surface region $1ps$ of low dislocation density region $1k$ has an area of 40% or more with respect to the whole surface $1ks$ of low dislocation density region $1k$ (namely the group III nitride crystal having a flat surface region ratio of 40% or more), one or more group III nitride layers can be epitaxially grown to produce a group III nitride semiconductor device having excellent characteristics with high yield. In view of this, the flat surface region ratio is preferably not less than 60% and more preferably not less than 80%.

Fourth Embodiment

Figure 5:
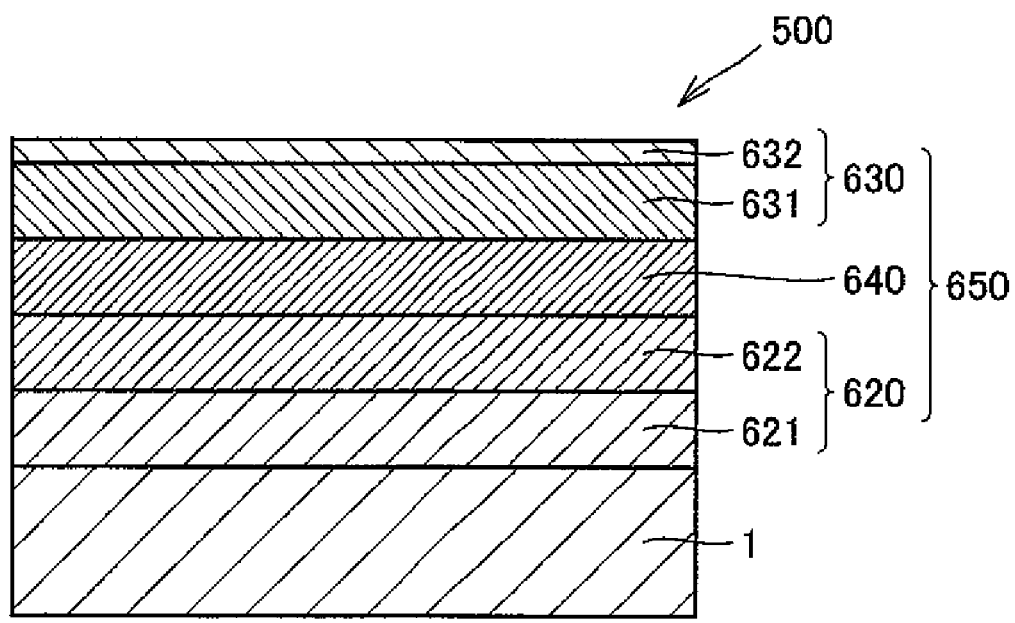
FIG. 5 is a schematic cross section showing a group III nitride stack according to the present invention.

Referring to FIG. 5, a group III nitride stack of the present invention includes group III nitride crystal 1 of the third embodiment and at least one group III nitride layer 650 that is epitaxially grown on a surface of group III nitride crystal 1. Group III nitride stack 500 of the present embodiment thus includes at least one group III nitride layer 650 that is epitaxially grown on a surface of the group III nitride crystal of the third embodiment, and therefore, the intensity (PL intensity) of the light emitted by means of the PL (photoluminescence) method is high.

More specifically, referring to FIG. 5, the group III nitride stack of the present embodiment includes at least one epitaxially-grown group III nitride layer on one main surface of an n-type GaN crystal substrate (group III nitride crystal 1). The at least one group III nitride layer includes an n-type semiconductor layer 620, a light emitting layer 640 and a p-type semiconductor layer 630. N-type semiconductor layer 620 includes an n-type GaN layer 621 of 1 µm in thickness and an n-type $Al_{0.1}Ga_{0.9}N$ layer 622 of 150 nm in thickness, and p-type semiconductor layer 630 includes a p-type $Al_{0.2}Ga_{0.8}N$ layer 631 of 20 nm in thickness and p-type GaN layer 632 of 150 nm in thickness. These layers are laid in order on each other. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

Fifth Embodiment

Referring to FIG. 5, a method for manufacturing a group III nitride stack of the present invention is specifically a method for manufacturing group III nitride stack 500 using group III nitride crystal 1 of the third embodiment, including the steps of preparing group III nitride crystal 1, and epitaxially growing at least one group III nitride layer 650 on a surface of group III nitride crystal 1. Thus, on a surface of the group III nitride crystal, one or more group III nitride layers can be epitaxially grown to produce a group III nitride stack having a high intensity (PL intensity) of the light emitted by means of the PL method.

Referring to FIG. 5, according to the method for manufacturing a group III nitride stack of the present embodiment, an n-type GaN crystal substrate (group III nitride crystal 1) is disposed in an MOCVD apparatus for example. Then, on one main surface of the n-type GaN crystal substrate (group III nitride crystal 1), the MOCVD (Metal Organic Chemical Vapor Deposition) method is used to epitaxially grow at least one group III nitride layer 650. Specifically, Group III nitride layer 650 includes n-type semiconductor layer 620, light emitting layer 640 and p-type semiconductor layer 630. N-type semiconductor layer 620 includes n-type GaN layer 621 of 1 μm in thickness and n-type $Al_{0.1}Ga_{0.8}N$ layer 622 of 150 nm in thickness, and p-type semiconductor layer 630 includes p-type $Al_{0.2}Ga_{0.8}N$ layer 631 of 20 nm in thickness and p-type GaN layer 632 of 150 nm in thickness. These layers are epitaxially grown in order. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

Sixth Embodiment

Figure 6:
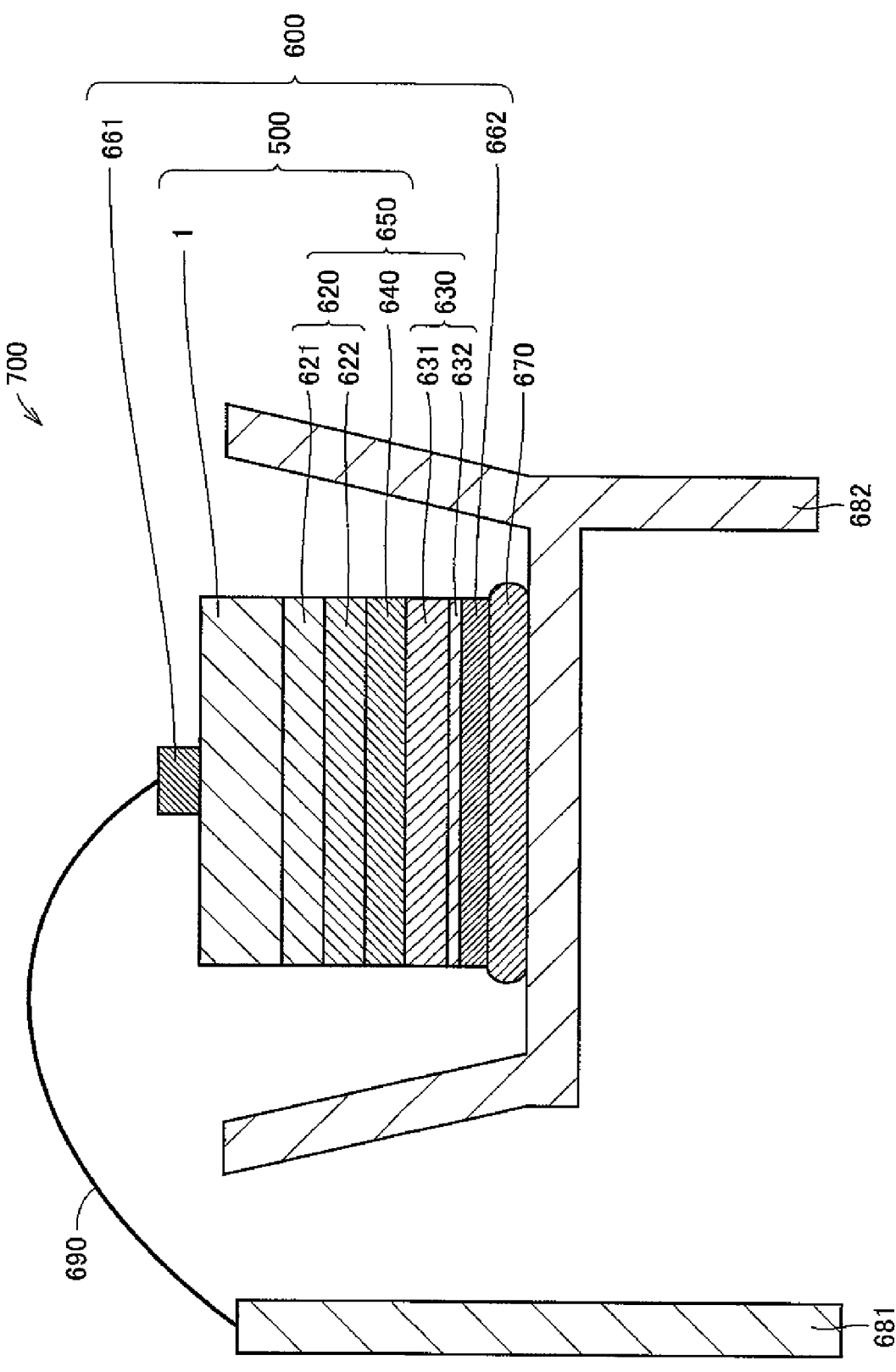
FIG. 6 is a schematic cross section showing a group III nitride semiconductor device according to the present invention.

Referring to FIG. 6, a group III nitride semiconductor device of the present invention includes group III nitride crystal 1 of the third embodiment, at least one group III nitride layer 650 that is epitaxially grown on a surface of group III nitride crystal 1, and electrodes 661, 662 formed on at least one of a surface of the outermost layer of group III nitride layer 650 and a surface of group III nitride crystal 1. Since group III nitride semiconductor device 600 of the present embodiment includes at least one group III nitride layer 650 that is epitaxially grown on the surface of the group III nitride crystal of the third embodiment, the semiconductor device has a high emission intensity.

More specifically, referring to FIG. 6, a group III nitride semiconductor device of the present embodiment includes at least one group III nitride layer 650 that is epitaxially grown on one main surface of an n-type GaN crystal substrate (group III nitride crystal 1). Group III nitride layer 650 includes n-type semiconductor layer 620, light emitting layer 640 and p-type semiconductor layer 630. N-type semiconductor layer 620 includes n-type GaN layer 621 of 1 μm in thickness and n-type $Al_{0.1}Ga_{0.9}N$ layer 622 of 150 nm in thickness, and p-type semiconductor layer 630 includes p-type $Al_{0.2}Ga_{0.8}N$ layer 631 of 20 nm in thickness and p-type GaN layer 632 of 150 nm in thickness. These layers are laid in order on each other. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

Further, the group III nitride semiconductor device of the present embodiment includes a second electrode 662 (p side electrode) on p-type GaN layer 632 that is the outermost layer of group III nitride layer 650 and a first electrode 661 (n side electrode) on the other main surface of the n-type GaN crystal substrate (group III nitride crystal 1), as the electrodes formed on at least one of a surface of the outermost layer of group III nitride layer 650 and a surface of group III nitride crystal 1.

In a semiconductor device 700 including an LED (light emitting diode) as group III nitride semiconductor device 600 as described above, the second electrode (p side electrode) of group III nitride semiconductor device 600 is bonded to a conductor 682 with a solder layer 670 and the first electrode (n side electrode) is bonded to a conductor 681 with a wire 690.

Seventh Embodiment

A method for manufacturing a group III nitride semiconductor device of the present invention is a method for manufacturing a semiconductor device using the group III nitride crystal of the third embodiment, and includes the steps of preparing group III nitride crystal 1, epitaxially growing at least one group III nitride layer 650 on a surface of group III nitride crystal 1, and forming electrodes 661, 662 on at least one of a surface of the outermost layer of group III nitride layer 650 and a surface of group III nitride crystal 1. The group III nitride semiconductor device can be produced with high yield by epitaxially growing one or more group III nitride layers on a surface of the group III nitride crystal.

Referring to FIG. 6, according to the method for manufacturing a group III nitride semiconductor device of the present embodiment, an n-type GaN crystal substrate (group III nitride crystal 1) is disposed in an MOCVD apparatus for example. Then, on one main surface of the n-type GaN crystal substrate (group III nitride crystal 1), the MOCVD petal Organic Chemical Vapor Deposition) method is used to epitaxially grow at least one group III nitride layer 650 in order. Specifically, group III nitride layer 650 includes n-type semiconductor layer 620, light emitting layer 640 and p-type semiconductor layer 630. N-type semiconductor layer 620 includes n-type GaN layer 621 of 1 μm in thickness and n-type $Al_{0.1}Ga_{0.8}N$ layer 622 of 150 nm in thickness, and p-type semiconductor layer 630 includes p-type $Al_{0.2}Ga_{0.8}N$ layer 631 of 20 nm in thickness and p-type GaN layer 632 of 150 nm in thickness. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

Subsequently, on the other main surface of the n-type GaN crystal substrate (group III nitride crystal 1), an n side electrode with a diameter of 100 μm is formed as first electrode 661. On p-type GaN layer 632, a p side electrode is formed as second electrode 662. The above described stack is formed into a chip of 400 μm×400 μm to produce an LED (light emitting diode) as group III nitride semiconductor device 600.

After this, the p side electrode is bonded to conductor 682 with solder layer 670 while the n side electrode and conductor 681 are bonded together with wire 690 to produce semiconductor device 700 including the LED.

EXAMPLES A1-A7, COMPARATIVE EXAMPLES AR1, AR2

1. Lapping Step

An n-type GaN crystal grown by the HVPE method was sliced along a plane parallel to a {0001} plane to obtain an n-type GaN crystal substrate (group III nitride crystal 1) of 50 mm (diameter)×0.5 mm (thickness). Referring to FIG. 1, the rear surface (N atomic surface that is (000-1) plane)) of the n-type GaN crystal substrate (group III nitride crystal 1) was attached to crystal holder 11 of a ceramic material with a wax. Surface plate 15 of 300 mm in diameter was placed in a lapping apparatus (not shown). Diamond abrasive grains (hard abrasive grains 16) with a grain size of 2 μm were sprayed from abrasive grain feed port 19 to surface plate 15 made of Sn (tin), while surface plate 15 was rotated about its rotational axis 15c. Further, weight 14 was put on crystal holder 11 to press the n-type GaN crystal substrate (group III nitride crystal 1) against surface plate 15, while the n-type GaN crystal substrate (group III nitride crystal 1) was rotated about rotational axis 11c of crystal holder 11. In this way, the surface (Ga atomic surface that is (0001) plane) of the n-type GaN crystal was lapped. The diamond abrasive grains have a Mohs hardness of 10.

Here, the lapping pressure was 29.4 kPa (300 gf/cm$^2$), the number of rotations of the n-type GaN crystal substrate (group III nitride crystal 1) and that of surface plate 15 were both 30 rpm (rotations/min) to 100 rpm (rotations/min), and the lapping time was 30 minutes. Through the lapping, the surface of the n-type GaN crystal substrate was made specular. After the lapping, the n-type GaN crystal substrate had a surface roughness Ry of 30 nm and a surface roughness Ra of 3.0 nm.

2. Abrasive-Grain-Free Polishing Step

Referring next to FIGS. 1 and 2, the n-type GaN crystal substrate (group III nitride crystal 1) having been lapped and remained secured to crystal holder 11 (corresponding to crystal holder 21 in FIG. 2) was polished without abrasive grains. On surface plate 25 with a diameter of 380 mm that was placed in a polishing apparatus (not shown), polishing pad 28 was disposed. Polishing solution 27 without containing abrasive grains was fed from polishing solution feed port 29 to polishing pad 28, while polishing pad 28 was rotated about rotational axis 25c. Further, weight 24 was put on crystal holder 21 to press the lapped n-type GaN crystal substrate (group III nitride crystal 1) secured to crystal holder 21 against polishing pad 28, while the n-type GaN crystal substrate (group III nitride crystal 1) was rotated about rotational axis 21c of crystal holder 21. In this way, the surface (Ga atomic surface) of the n-type GaN crystal substrate (group III nitride crystal 1) was polished.

Here, as polishing solution 27 without containing abrasive grains, a solution containing an acid and an oxidizer as shown in Table 1 and having a pH and an ORP shown in Table 1 was used. In Table 1, TCIA represents trichloroisocyanuric acid, and DCIA-Na represents sodium dichloroisocyanurate. As polishing pad 28, a non-woven pad made of polyurethane and having a compressibility shown in Table 1 was used. As surface plate 25, a stainless surface plate was used. As to the polishing conditions, the polishing pressure was 29.4 kPa (300 gf/cm$^2$), the number of rotations of the n-type GaN crystal substrate (group III nitride crystal 1) and that of polishing pad 28 were both 30 rpm (rotations/min) to 100 rpm (rotations/min), and the polishing time was 30 minutes.

Through the above-described steps, respective crystals of Examples A1 to A7 and Comparative Examples AR1 and AR2 shown in Table 1 were surface-treated. The impurity concentration, surface roughness Ra and surface roughness Ry of the crystal surface after treated were measured. Here, the concentration of impurity C (carbon) was measured by means of AES (Auger Electron Spectroscopy). C is considered to be originated from the diamond abrasive grains. Surface roughness Ra and surface roughness Ry were calculated through AFM (Atomic Force Microscope) observation in the range of a square of 10 μm×10 μm of the crystal surface. The results are summarized in Table 1.

TABLE 1

| | | | Example A · Comparative Example AR | | | | | | | | |
|---|---|---|---|---|---|---|---|---|---|---|---|
| | | | Comparative Example AR1 | Example A1 | Example A2 | Example A3 | Example A4 | Comparative Example AR2 | Example A5 | Example A6 | Example A7 |
| lapping | abrasive grain | material | diamond | diamond | diamond | diamond | diamond | diamond | diamond | diamond | diamond |
| | | grain size (μm) | 2 | 2 | 2 | 2 | 2 | 2 | 2 | 2 | 2 |
| | surface plate | material | Sn | Sn | Sn | Sn | Sn | Sn | Sn | Sn | Sn |
| abrasive-grain-free polishing | polishing solution | acid | HCl | HCl | HCl | citric acid | citric acid | — | HCl | HCl | citric acid |
| | | oxidizer | TCIA | TCIA | DCIA-Na | DCIA-Na | DCIA-Na | — | — | — | — |
| | | pH | 0.5 | 1 | 2 | 4 | 6 | 7 | 1 | 2 | 4 |
| | | ORP (mV) | 1600 | 1550 | 1500 | 1350 | 1200 | 800 | 1100 | 1000 | 850 |
| | compressibility of polishing pad (%) | | 3 | 3 | 3 | 3 | 3 | 3 | 3 | 3 | 3 |
| | polishing pressure (kPa) | | 29.4 | 29.4 | 29.4 | 29.4 | 29.4 | 29.4 | 29.4 | 29.4 | 29.4 |
| evaluation of crystal surface | impurity | C (mass %) | 3.9 | 4.2 | 4.6 | 5.3 | 8.6 | 15.2 | 4.4 | 4.9 | 5.8 |
| | surface roughness Ry (nm) | | 52 | 33 | 26 | 24 | 19 | 19 | 31 | 23 | 21 |
| | surface roughness Ra (nm) | | 4.5 | 3.2 | 2.2 | 2.2 | 2 | 1.8 | 3 | 2 | 1.9 |

Referring to Table 1, as seen from Examples A1 to A7, through the surface treatment including the lapping step using hard abrasive grains with a Mohs hardness higher than 7 (diamond abrasive grains with a Mohs hardness of 10 for example), and the abrasive-grain-free polishing step using a polishing solution without containing abrasive grains and having a pH of not less than 1 and not more than 6 as well as a polishing pad having a compressibility of not less than 1.5% and not more than 20%, performed under the condition that the polishing pressure was not less than 0.98 kPa and not more than 58.8 kPa, a crystal surface with low impurity concentration and small surface roughness Ra and small surface roughness Ry was obtained. As for Comparative Example AR1, because of the fact that the polishing solution without containing abrasive grains had a pH of 0.5 which is lower than 1, surface roughness Ra and surface roughness Ry were larger. As for Comparative Example AR2, because of the pH of 7 which is higher than 6, the concentration of impurity C (carbon) remaining at the crystal surface was higher.

EXAMPLES B1-B5, COMPARATIVE EXAMPLE BR1

1. Lapping Step

A surface (Ga atomic surface) of an n-type GaN crystal substrate (group III nitride crystal 1) was lapped in a similar manner to Example A1 except that diamond abrasive grains with a grain size of 3 μm were used as hard abrasive grains 16 and a surface plate made of a Sn—Bi (Bi content: 2% by mass) alloy was used as surface plate 15. Through the lapping, the surface of the n-type GaN crystal substrate was made specular. After the lapping, the n-type GaN crystal substrate had a surface roughness Ry of 58 nm and a surface roughness Ra of 5.1 nm.

2. Abrasive-grain-free Polishing Step

Subsequently, the surface (Ga atomic surface) of the n-type GaN crystal substrate (group III nitride crystal 1) was polished without abrasive grains in a similar manner to Example A1, except that a solution containing an alkali and an oxidizer shown in Table 2 and having a pH and an ORP shown in Table 2 was used as polishing solution 27 without containing abrasive grains, a suede pad made of polyurethane having a compressibility shown in Table 2 was used as polishing pad 28, a stainless surface plate was used as surface plate 25, and the polishing pressure was 19.6 kPa (200 gf/cm$^2$). Here, TCIA represents trichloroisocyanuric acid, and DCIA-Na represents sodium dichloroisocyanurate.

Through the above-described steps, respective crystals of Examples B1 to B7 and Comparative Example BR1 shown in Table 2 were surface-treated. The impurity concentration, surface roughness Ry and surface roughness Ra of the crystal surface after treated were measured. The concentration of impurity C (carbon), surface roughness Ry and surface roughness Ra were determined in a similar manner to Example A1. The results are summarized in Table 2.

tion, small surface roughness Ra and small surface roughness Ry was obtained. As for Comparative Example BR1, because of the pH of 7 which is higher than 6, the concentration of impurity C (carbon) remaining at the crystal surface was higher.

EXAMPLES C1-C13

1. Lapping Step

A surface (Ga atomic surface in a low dislocation density region and N atomic surface in a high dislocation density region, the surface is (0001) plane) of an n-type GaN crystal substrate (group III nitride crystal 1) was lapped in a similar manner to Example A1, except that an n-type GaN crystal substrate grown by the HVPE method to have facets as formed and including a high dislocation density region and a low dislocation density region was used as group III nitride crystal 1, SiC abrasive grains (Mohs hardness: 9.5) with a grain size of 3 μm were used as hard abrasive grains 16, and a stainless surface plate to which a non-woven pad made of polyurethane was attached was used as surface plate 15. Through the lapping, the surface of the n-type GaN crystal substrate was made specular. After the lapping, the n-type GaN crystal substrate had a surface roughness Ry of 30 nm and a surface roughness Ra of 3.2 nm.

2. Abrasive-grain-free Polishing Step

Subsequently, the Ga atomic surface ((0001) plane) of the n-type GaN crystal substrate (group III nitride crystal 1) was polished without abrasive grains, in a similar manner to Example A1, except that a solution containing an alkali shown in Table 3 and having a pH and an ORP shown in Table 3 was used as polishing solution 27 without containing abrasive grains, a polyurethane foam pad having a compressibility shown in Table 3 was used as polishing pad 28, an aluminum

TABLE 2

|  |  |  | Example B · Comparative Example BR | | | | | |
|---|---|---|---|---|---|---|---|---|
|  |  |  | Comparative Example BR1 | Example B1 | Example B2 | Example B3 | Example B4 | Example B5 |
| lapping | abrasive grain | material | diamond | diamond | diamond | diamond | diamond | diamond |
|  |  | grain size (μm) | 3 | 3 | 3 | 3 | 3 | 3 |
|  | surface plate | material | Sn—Bi | Sn—Bi | Sn—Bi | Sn—Bi | Sn—Bi | Sn—Bi |
| abrasive-grain-free polishing | polishing solution | alkali, salt | — | sodium carbonate | KOH | KOH | KOH | sodium carbonate |
|  |  | oxidizer | — | — | — | — | — | DCIA-Na |
|  |  | pH | 7 | 8.5 | 10 | 12 | 14 | 10 |
|  |  | ORP (mV) | 650 | 600 | 500 | 400 | 250 | 1050 |
|  | compressibility of polishing pad (%) |  | 6 | 6 | 6 | 6 | 6 | 6 |
|  | polishing pressure (kPa) |  | 19.6 | 19.6 | 19.6 | 19.6 | 19.6 | 19.6 |
| evaluation of crystal surface | impurity | C (mass %) | 19.2 | 9.2 | 5.6 | 4.3 | 3.6 | 4.1 |
|  | surface roughness Ry (nm) |  | 30 | 33 | 35 | 48 | 78 | 42 |
|  | surface roughness Ra (nm) |  | 2.9 | 2.9 | 3 | 4.5 | 6.2 | 3.5 |

Referring to Table 2, as seen from Examples B1 to B5, through the surface treatment including the lapping step using hard abrasive grains with a Mohs hardness higher than 7 (for example, diamond abrasive grains with a Mohs hardness of 10), and the abrasive-grain-free polishing step using a polishing solution without containing abrasive grains and having a pH of not less than 8.5 and not more than 14 as well as a polishing pad having a compressibility of not less than 1.5% and not more than 20%, performed under the condition that the polishing pressure was not less than 0.98 kPa and not more than 58.8 kPa, a crystal surface with low impurity concentrasurface plate was used as surface plate 25, and a polishing pressure shown in Table 3 was used.

Through the above-described steps, surface treatment was performed on Examples C1 to C13 shown in Table 3. For the crystal surface after treated, the impurity concentration, the depth of the depression in the high dislocation density region (namely level difference D shown in FIG. 4 between the surface of low dislocation density region 1$k$ and the surface of high dislocation density region 1$h$), the flat surface region ratio (namely the ratio (percentage) of the area of flat surface region 1$ps$ of low dislocation density region 1$k$ to the area of the whole surface 1ks of low dislocation density region 1k), and surface roughness Ry and surface roughness Ra were measured. Here, the concentration of impurity Si (silicon) was measured by the TXRF (total reflection x-ray fluorescence) method. This Si is considered to be originated from the SiC abrasive grains. The depth of the depression in the high dislocation density region was measured using an interferometry profilometer. The flat surface region ratio was calculated from surface profile data obtained using the interferometry profilometer. Surface roughness Ry and surface roughness Ra were determined similarly to Example A1. The results are summarized in Table 3.

abrasive grains with a Mohs hardness of 9.5 for example), and the abrasive-grain-free polishing step using a polishing solution containing no abrasive grains and having a pH of not less than 1 and not more than 6.5 as well as a polishing pad with a compressibility of not less than 1.5% and not more than 20%, performed under the condition that the polishing pressure was not less than 0.98 kPa and not more than 58.8 kPa, a crystal surface where the impurity concentration was low, the depth of the depression in the high dislocation density region was small, the flat surface region ratio was high, and surface roughness Ry and surface roughness Ra were small, was obtained. As for Example C1, the low compressibility of the

TABLE 3

| | | | Example C | | | | | | |
|---|---|---|---|---|---|---|---|---|---|
| | | | Example C1 | Example C2 | Example C3 | Example C4 | Example C5 | Example C6 | Example C7 |
| lapping | abrasive grain | material | SiC | SiC | SiC | SiC | SiC | SiC | SiC |
| | | grain size (μm) | 3 | 3 | 3 | 3 | 3 | 3 | 3 |
| | pad on surface plate | material, form | polyurethane non-woven | polyurethane non-woven | polyurethane non-woven | polyurethane non-woven | polyurethane non-woven | polyurethane non-woven | polyurethane non-woven |
| abrasive-grain-free polishing | polishing solution | alkali | KOH | KOH | KOH | KOH | KOH | KOH | KOH |
| | | oxidizer | — | — | — | — | — | — | — |
| | | pH | 13 | 13 | 13 | 13 | 13 | 13 | 13 |
| | | ORP (mV) | 350 | 350 | 350 | 350 | 350 | 350 | 350 |
| | compressibility of polishing pad (%) | | 1 | 1.5 | 3 | 7 | 10 | 20 | 25 |
| | polishing pressure (kPa) | | 19.6 | 19.6 | 19.6 | 19.6 | 19.6 | 19.6 | 19.6 |
| evaluation of crystal surface | impurity Si ($\times 10^{10}$ cm$^{-2}$) | | 1100 | 630 | 580 | 720 | 480 | 390 | 320 |
| | depression depth of high dislocation density region (nm) | | 400 | 500 | 700 | 1200 | 2100 | 3000 | 4200 |
| | flat surface region ratio (%) | | 95 | 90 | 85 | 80 | 80 | 75 | 70 |
| | surface roughness Ry (nm) | | 42 | 31 | 29 | 24 | 23 | 25 | 28 |
| | surface roughness Ra (nm) | | 4.5 | 3.3 | 3 | 2.6 | 2.4 | 2.7 | 2.9 |

| | | | Example C | | | | | |
|---|---|---|---|---|---|---|---|---|
| | | | Example C8 | Example C9 | Example C10 | Example C11 | Example C12 | Example C13 |
| lapping | abrasive grain | material | SiC | SiC | SiC | SiC | SiC | SiC |
| | | grain size (μm) | 3 | 3 | 3 | 3 | 3 | 3 |
| | pad on surface plate | material, form | polyurethane non-woven | polyurethane non-woven | polyurethane non-woven | polyurethane non-woven | polyurethane non-woven | polyurethane non-woven |
| abrasive-grain-free polishing | polishing solution | alkali | KOH | KOH | KOH | KOH | KOH | KOH |
| | | oxidizer | — | — | — | — | — | — |
| | | pH | 13 | 13 | 13 | 13 | 13 | 13 |
| | | ORP (mV) | 350 | 350 | 350 | 350 | 350 | 350 |
| | compressibility of polishing pad (%) | | 7 | 7 | 7 | 7 | 7 | 7 |
| | polishing pressure (kPa) | | 0.49 | 0.98 | 4.9 | 39.2 | 58.8 | 78.5 |
| evaluation of crystal surface | impurity Si ($\times 10^{10}$ cm$^{-2}$) | | 8200 | 2900 | 950 | 570 | 240 | 120 |
| | depression depth of high dislocation density region (nm) | | 350 | 450 | 600 | 1900 | 3000 | 4100 |
| | flat surface region ratio (%) | | 100 | 95 | 90 | 80 | 75 | 70 |
| | surface roughness Ry (nm) | | 23 | 22 | 24 | 32 | 35 | 47 |
| | surface roughness Ra (nm) | | 2.1 | 2 | 2.2 | 2.8 | 3.4 | 4.3 |

Referring to Table 3, as seen from Examples C1 to C13, through the surface treatment including the lapping step using hard abrasive grains with a Mohs hardness higher than 7 (SiC polishing pad increased surface roughness Ry and surface roughness Ra. As for Example C7, the high compressibility of the polishing pad increased the depth of the depression in the high dislocation density region. As for Example C8, the low polishing pressure increased the impurity concentration. As for Example C13, the high polishing pressure increased the depth of the depression in the high dislocation density region.

EXAMPLES D1-D7

1. Lapping Step

A surface (Ga atomic surface in a low dislocation density region and N atomic surface in a high dislocation density region, the surface is (0001) plane) of an n-type GaN crystal substrate (group III nitride crystal 1) was lapped in a similar manner to Example A1, except that an n-type GaN crystal substrate grown by the HVPE method to have facets as formed and including a high dislocation density region and a low dislocation density region was used as group III nitride crystal 1, $Al_2O_3$ abrasive grains (Mohs hardness: 9) with a grain size of 4 μm were used as hard abrasive grains 16, a stainless surface plate to which a non-woven pad made of polyurethane was attached was used as surface plate 15, and the lapping pressure was 29.4 kPa (300 gf/cm$^2$). Through the lapping, the surface of the n-type GaN crystal substrate was made specular. After the lapping, the n-type GaN crystal substrate had a surface roughness Ry of 26 nm and a surface roughness Ra of 2.4 nm.

2. Abrasive-grain-free Polishing Step

Subsequently, the Ga atomic surface ((0001) plane) of the n-type GaN crystal substrate (group III nitride crystal 1) was polished without abrasive grains in a similar manner to Example A1, except that a solution containing an acid and an oxidizer shown in Table 4 and having a pH and an ORP shown in Table 4 was used as polishing solution 27 without containing abrasive grains, a polyurethane foam pad having a compressibility shown in Table 4 was used as polishing pad 28, a stainless surface plate was used as surface plate 25, and the polishing pressure was 39.2 kPa (400 gf/cm$^2$). Here, TCIA in Table 4 represents trichloroisocyanuric acid.

Through the above-described steps, surface treatment was performed on Examples D1 to D7 shown in Table 4. For the crystal surface after treated, the impurity concentration, the depth of the depression in the high dislocation density region (namely level difference D shown in FIGS. 4A and 4B between the surface of low dislocation density region 1k and the surface of high dislocation density region 1h), the flat surface region ratio (namely the ratio (percentage) of the area of flat surface region 1ps in low dislocation density region 1k to the area of the whole surface 1ks of low dislocation density region 1k), and surface roughness Ry and surface roughness Ra were measured. Here, the concentration of impurity Al (aluminum) was measured by the TXRF (total reflection x-ray fluorescence) method. This Al is considered to be originated from the $Al_2O_3$ abrasive grains. The depth of the depression in the high dislocation density region was measured using an interferometry profilometer. The flat surface region ratio was calculated from surface profile data obtained using the interferometry profilometer. Surface roughness Ry and surface roughness Ra were determined similarly to Example A1. The results are summarized in Table 4.

TABLE 4

| | | | Example D | | | | | | |
|---|---|---|---|---|---|---|---|---|---|
| | | | Example D1 | Example D2 | Example D3 | Example D4 | Example D5 | Example D6 | Example D7 |
| lapping | abrasive grain | material | $Al_2O_3$ | $Al_2O_3$ | $Al_2O_3$ | $Al_2O_3$ | $Al_2O_3$ | $Al_2O_3$ | $Al_2O_3$ |
| | | grain size (μm) | 4 | 4 | 4 | 4 | 4 | 4 | 4 |
| | pad on surface plate | material, form | polyurethane non-woven | polyurethane non-woven | polyurethane non-woven | polyurethane non-woven | polyurethane non-woven | polyurethane non-woven | polyurethane non-woven |
| abrasive-grain-free polishing | polishing solution | acid | malic acid | malic acid | malic acid | malic acid | malic acid | malic acid | malic acid |
| | | oxidizer | TCIA | TCIA | TCIA | TCIA | TCIA | TCIA | TCIA |
| | | pH | 2 | 2 | 2 | 2 | 2 | 2 | 2 |
| | | ORP (mV) | 1450 | 1450 | 1450 | 1450 | 1450 | 1450 | 1450 |
| | compressibility of polishing pad (%) | | 1 | 1.5 | 3 | 7 | 10 | 20 | 25 |
| | polishing pressure (kPa) | | 39.2 | 39.2 | 39.2 | 39.2 | 39.2 | 39.2 | 39.2 |
| evaluation of crystal surface | impurity Al ($\times 10^{10}$ cm$^{-2}$) | | 1400 | 740 | 630 | 850 | 520 | 440 | 390 |
| | depression depth of high dislocation density region (nm) | | 400 | 600 | 800 | 1400 | 2200 | 3000 | 4800 |
| | flat surface region ratio (%) | | 95 | 90 | 80 | 75 | 70 | 70 | 60 |
| | surface roughness Ry (nm) | | 38 | 27 | 25 | 21 | 18 | 24 | 27 |
| | surface roughness Ra (nm) | | 3.5 | 2.4 | 2.2 | 1.8 | 1.4 | 2.1 | 2.5 |

Referring to Table 4, as seen from Examples D1 to D7, through the surface treatment including the lapping step using hard abrasive grains with a Mohs hardness higher than 7 ($Al_2O_3$ abrasive grains with a Mohs hardness of 9 for example), and the abrasive-grain-free polishing step using a polishing solution without containing abrasive grains and having a pH of not less than 1 and not more than 6.5 and a polishing pad with a compressibility of not less than 1.5% and not more than 20%, performed under the condition that the polishing pressure was not less than 0.98 kPa and not more than 58.8 kPa, the crystal surface having a low impurity concentration, a small depth of the depression in the high dislocation density region, a high flat surface region ratio, and small surface roughness Ry and small surface roughness Ra was obtained. As for Example D1, the low compressibility of the polishing pad increased surface roughness Ry and surface roughness Ra. As for Example D7, the high compressibility of the polishing pad increased the depth of the depression in the high dislocation density region.

EXAMPLES E1-E12

1. Lapping Step

A surface (Ga atomic surface that is (0001) plane) of an n-type GaN crystal substrate (group III nitride crystal 1) was lapped in a similar manner to Example A1, except that diamond abrasive grains (Mohs hardness: 10) with a grain size of 2 µm were used as hard abrasive grains 16, a stainless surface plate to which a non-woven pad made of polyurethane was attached was used as surface plate 15, and the lapping pressure was 29.4 kPa (300 gf/cm$^2$). Through the lapping, the surface of the n-type GaN crystal substrate was made specular. After the lapping, the n-type GaN crystal substrate had a surface roughness Ry of 25 nm and a surface roughness Ra of 2.3 nm.

2. Soft Abrasive Grain Polishing Step

Subsequently, referring to FIGS. 1 and 3, the lapped n-type GaN crystal substrate (group III nitride crystal 1) remained secured to crystal holder 11 (corresponding to crystal holder 31 in FIG. 3) was polished with soft abrasive grains in the following manner. On surface plate 35 with a diameter of 300 mm placed in a polishing apparatus (not shown), polishing pad 38 was disposed. The surface (Ga atomic surface) of the n-type GaN crystal substrate (group III nitride crystal 1) was polished by supplying polishing solution 37 containing soft abrasive grains 36 from polishing solution feed port 39 to polishing pad 38 while rotating polishing pad 38 about rotational axis 35c, and pressing the n-type GaN crystal substrate (group III nitride crystal 1) secured to crystal holder 31 against polishing pad 38 by putting weight 34 on crystal holder 31 while rotating the n-type GaN crystal substrate (group III nitride crystal 1) about rotational axis 31c of crystal holder 31.

Here, $Fe_2O_3$ abrasive grains (Mohs hardness: 6) with a grain size of 0.5 µm were used as soft abrasive grains 36. A solution containing HCl (hydrochloric acid) as acid and $H_2O_2$ as oxidizer and having a pH of 2 and an ORP of 700 mV was used as polishing solution 37 containing soft abrasive grains 36. A foam pad of polyurethane having a compressibility shown in Table 5 was used as polishing pad 38. An aluminum surface plate was used as surface plate 35. The polishing was performed under the conditions that the polishing pressure was the one shown in Table 5, the number of rotations of the n-type GaN crystal substrate (group III nitride crystal 1) and that of polishing pad 38 were both 30 rpm (rotations/min) to 100 rpm (rotations/min), and the polishing time was 60 minutes.

3. Abrasive-grain-free Polishing Step

The surface (Ga atomic surface) of the n-type GaN crystal substrate (group III nitride crystal 1) was polished without abrasive grains in a similar manner to Example A1, except that a solution containing HCl (hydrochloric acid) as acid and $H_2O_2$ as oxidizer and having a pH of 2 and an ORP of 700 mV was used as polishing solution 27 without containing abrasive grains, a suede pad of polyurethane having a compressibility shown in Table 5 was used as polishing pad 28, a stainless surface plate was used as surface plate 25, and the polishing pressure was 39.2 kPa (400 gf/cm$^2$).

Through the above-described steps, surface treatment was performed on Examples E1 to E12 shown in Table 5. For the crystal surface after treated, the impurity concentration, the depth of the depression in the high dislocation density region (namely the difference in level between the surface of the low dislocation density region and the surface of the high dislocation density region), the flat surface region ratio (namely the ratio (percentage) of the area of flat surface region 1ps of low dislocation density region 1k to the area of the whole surface 1ks of low dislocation density region 1k), surface roughness Ry and surface roughness Ra, and the thickness of the work-affected layer were measured. Here, the concentration of impurity C (carbon) was measured using the AES (Auger Electron Spectroscopy) method. C is considered to be originated from the diamond abrasive grains that are hard abrasive grains. The concentration of impurity Fe (iron) was measured using the TXRF (total reflection x-ray fluorescence) method. Fe is considered to be originated from soft abrasive grains $Fe_2O_3$. Surface roughness Ra and surface roughness Ry were determined similarly to Example A1. The results are summarized in Table 5.

4. Process of Manufacturing Group III Nitride Stack

Subsequently, referring to FIG. 5, the n-type GaN crystal substrate (group III nitride crystal 1) polished without abrasive grains for each of Examples E1 to E12 as described above was placed in an MOCVD apparatus. On one main surface (Ga atomic surface) of the n-type GaN crystal substrate (group III nitride crystal 1), n-type semiconductor layer 620 including n-type GaN layer 621 (dopant: Si) of 1 µm in thickness and n-type $Al_{0.1}Ga_{0.9}N$ layer 622 (dopant: Si) of 150 nm in thickness, light emitting layer 640, and p-type semiconductor layer 630 including p-type $Al_{0.2}Ga_{0.8}N$ layer 631 (dopant: Mg) of 20 nm in thickness and p-type GaN layer 632 (dopant: Mg) of 150 nm in thickness were formed successively by the MOCVD method to produce group III nitride stack 500. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

The PL (photoluminescence) method was used to cause thus obtained group III nitride stack 500 to emit light, and the intensity (PL intensity) of the light was measured. The results are summarized in Table 5.

5. Process of Manufacturing Group III Nitride Semiconductor Device

Further, referring to FIG. 6, on the other main surface (N atomic surface) of the n-type GaN crystal substrate (group III nitride crystal 1) of group III nitride stack 500 for each of Examples E1 to E12 as described above, a stack structure made up of a Ti layer of 200 nm in thickness, an Al layer of 1000 nm in thickness, a Ti layer of 200 nm in thickness, and an Au layer of 2000 nm in thickness was formed and then heated in a nitrogen atmosphere to form an n side electrode of 100 µm in diameter as first electrode 661. On p-type GaN layer 632 of group III nitride stack 500, a stack structure made up of an Ni layer of 4 nm in thickness and an Au layer of 4 nm in thickness was formed and then heated in an inert gas atmosphere to form a p side electrode as second electrode 662. The above-described stack was formed into a chip of 400 µm×400 µm in size to produce an LED (light emitting diode) as group III nitride semiconductor device 600.

Subsequently, the p side electrode (second electrode 662) was bonded to conductor 682 with solder layer 670 while the n side electrode (first electrode 661) and conductor 681 were bonded together with wire 690 to produce semiconductor device 700 including the LED.

For each of the Examples, 200 semiconductor devices 700 including respective group III nitride semiconductor devices 600 as described above were manufactured to examine the properties of the devices. Of the manufactured devices, those having predetermined properties were extracted as effective products. The manufacturing yield (%) is shown in Table 5.

TABLE 5

| | | | Example E | | | | | |
|---|---|---|---|---|---|---|---|---|
| | | | Example E1 | Example E2 | Example E3 | Example E4 | Example E5 | Example E6 |
| lapping | abrasive grain | material | diamond | diamond | diamond | diamond | diamond | diamond |
| | | grain size (μm) | 2 | 2 | 2 | 2 | 2 | 2 |
| | pad on surface plate | material, form | polyurethane non-woven | polyurethane non-woven | polyurethane non-woven | polyurethane non-woven | polyurethane non-woven | polyurethane non-woven |
| soft abrasive grain polishing | abrasive grain | material | $Fe_2O_3$ | $Fe_2O_3$ | $Fe_2O_3$ | $Fe_2O_3$ | $Fe_2O_3$ | $Fe_2O_3$ |
| | | grain size (μm) | 0.5 | 0.5 | 0.5 | 0.5 | 0.5 | 0.5 |
| | polishing solution | acid | HCl | HCl | HCl | HCl | HCl | HCl |
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 0.5 | 0.8 | 2 | 5 | 10 | 2 |
| | polishing pressure (kPa) | | 58.8 | 58.8 | 58.8 | 58.8 | 58.8 | 2.9 |
| abrasive-grain-free polishing | polishing solution | acid | HCl | HCl | HCl | HCl | HCl | HCl |
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 8 | 8 | 8 | 8 | 8 | 8 |
| | polishing pressure (kPa) | | 39.2 | 39.2 | 39.2 | 39.2 | 39.2 | 39.2 |
| evaluation of crystal surface | impurity | C (mass %) | 8.9 | 7.2 | 5.5 | 4.8 | 3.2 | 14 |
| | | Fe ($\times 10^{10}$ cm$^{-2}$) | 300 | 120 | 60 | 30 | 20 | 0 |
| | surface roughness Ry (nm) | | 32 | 20 | 14 | 8 | 6.1 | 25 |
| | surface roughness Ra (nm) | | 3.1 | 2 | 1.2 | 0.81 | 0.62 | 2.4 |
| | work-affected layer (nm) | | 240 | 30 | 0 | 30 | 50 | 320 |
| stack characteristic | PL intensity (AU) | | 35 | 65 | 100 | 82 | 75 | 29 |
| device characteristic | yield (%) | | 42 | 71 | 91 | 85 | 79 | 36 |

| | | | Example E | | | | | |
|---|---|---|---|---|---|---|---|---|
| | | | Example E7 | Example E8 | Example E9 | Example E10 | Example E11 | Example E12 |
| lapping | abrasive grain | material | diamond | diamond | diamond | diamond | diamond | diamond |
| | | grain size (μm) | 2 | 2 | 2 | 2 | 2 | 2 |
| | pad on surface plate | material, form | polyurethane non-woven | polyurethane non-woven | polyurethane non-woven | polyurethane non-woven | polyurethane non-woven | polyurethane non-woven |
| soft abrasive grain polishing | abrasive grain | material | $Fe_2O_3$ | $Fe_2O_3$ | $Fe_2O_3$ | $Fe_2O_3$ | $Fe_2O_3$ | $Fe_2O_3$ |
| | | grain size (μm) | 0.5 | 0.5 | 0.5 | 0.5 | 0.5 | 0.5 |
| | polishing solution | acid | HCl | HCl | HCl | HCl | HCl | HCl |
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 2 | 2 | 2 | 2 | 2 | 2 |
| | polishing pressure (kPa) | | 4.9 | 9.8 | 19.6 | 68.6 | 98.1 | 118 |
| abrasive-grain-free polishing | polishing solution | acid | HCl | HCl | HCl | HCl | HCl | HCl |
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 8 | 8 | 8 | 8 | 8 | 8 |
| | polishing pressure (kPa) | | 39.2 | 39.2 | 39.2 | 39.2 | 39.2 | 39.2 |
| evaluation of crystal surface | impurity | C (mass %) | 7.5 | 6.1 | 4.9 | 3.8 | 3.2 | 2.8 |
| | | Fe ($\times 10^{10}$ cm$^{-2}$) | 10 | 20 | 50 | 60 | 110 | 320 |
| | surface roughness Ry (nm) | | 20 | 9.1 | 46 | 34 | 33 | 11 |
| | surface roughness Ra (nm) | | 1.9 | 0.82 | 0.45 | 0.31 | 0.37 | 0.91 |
| | work-affected layer (nm) | | 50 | 20 | 0 | 0 | 30 | 50 |
| stack characteristic | PL intensity (AU) | | 55 | 72 | 95 | 98 | 88 | 65 |
| device characteristic | yield (%) | | 61 | 82 | 88 | 92 | 80 | 76 |

Referring to Table 5, as seen from Examples E1 to E12, through the surface treatment including the lapping step using hard abrasive grains with a Mohs hardness higher than 7 (diamond abrasive grains with a Mohs hardness of 10 for example), the soft abrasive grain polishing step using a polishing solution containing soft abrasive grains with a Mohs hardness of not more than 7 ($Fe_2O_3$ abrasive grains with a Mohs hardness of 6 for example) and using a polishing pad with a compressibility of not less than 0.8% and not more than 5%, performed under the condition that the polishing pressure was not less than 4.9 kPa and not more than 98 kPa, and the abrasive-grain-free polishing step using a polishing solution without containing abrasive grains and having a pH of not less than 1 and not more than 6.5 and using a polishing pad with a compressibility of not less than 1.5% and not more than 20%, performed under the condition that the polishing pressure was not less than 0.98 kPa and not more than 58.8 kPa, the crystal surface having a low impurity concentration, a small depth of depression in the high dislocation density region, a high flat surface region ratio, and a small surface roughness Ry and a small surface roughness Ra was obtained.

As for Example E1, the low compressibility of the polishing pad used in the soft abrasive grain polishing step increased surface roughness Ry and surface roughness Ra. As for Example E6, the low polishing pressure in the soft abrasive grain polishing step increased the concentration of impurity (C) originated from the hard abrasive grains. As for Example E12, the high polishing pressure in the soft abrasive grain polishing step increased the concentration of impurity (Fe) originated from the soft abrasive grains.

As for Examples E2 to E5 and E7 to E12, the low impurity concentration, the small surface roughness Ra and small surface roughness Ry, and the small thickness of the work-affected layer of the crystal surface increased the PL intensity of the group III nitride stack. Thus, the group III nitride semiconductor device was produced with high yield. In contrast, as for Example E1, the high impurity concentration and the large thickness of the work-affected layer decreased the PL intensity of the group III nitride stack and accordingly decreased the yield of the group III nitride semiconductor device. As for Example E6, the high impurity concentration and the large thickness of the work-affected layer of the crystal surface decreased the PL intensity of the group III nitride stack and accordingly decreased the yield of the group III nitride semiconductor device.

EXAMPLES F1-F12

1. Lapping Step

A surface (Ga atomic surface of a low dislocation density region and N atomic surface of a high dislocation density region) of an n-type GaN crystal substrate (group III nitride crystal 1) was lapped in a similar manner to Example A1, except that an n-type GaN crystal substrate grown by the HVPE method to have facets as formed and including a high dislocation density region and a low dislocation density region was used as group III nitride crystal 1, SiC abrasive grains (Mohs hardness: 9.5) with a grain size of 4 μm were used as hard abrasive grains 16, and a surface plate made of phenol resin was used as surface plate 15. Through the lapping, the surface of the n-type GaN crystal substrate was made specular. After the lapping, the n-type GaN crystal substrate had a surface roughness Ry of 32 nm and a surface roughness Ra of 3.4 nm.

2. Soft Abrasive Grain Polishing Step

Subsequently, referring to FIGS. 1 and 3, the lapped n-type GaN crystal substrate (group III nitride crystal 1) remained secured to crystal holder 11 (corresponding to crystal holder 31 in FIG. 3) was polished with soft abrasive grains in the following manner. On surface plate 35 with a diameter of 300 mm placed in a polishing apparatus (not shown), polishing pad 38 was disposed. The surface (Ga atomic surface of the low dislocation density region and N atomic surface of the high dislocation density region) of the n-type GaN crystal substrate (group III nitride crystal 1) was polished by supplying polishing solution 37 containing soft abrasive grains 36 from polishing solution feed port 39 to polishing pad 38 while rotating polishing pad 38 about rotational axis 35c, and pressing the n-type GaN crystal substrate (group III nitride crystal 1) secured to crystal holder 31 against polishing pad 38 by putting weight 34 on crystal holder 31 while rotating the n-type GaN crystal substrate (group III nitride crystal 1) about rotational axis 31c of crystal holder 31.

Here, $SiO_2$ abrasive grains (Mohs hardness: 7) with a grain size of 0.1 μm were used as soft abrasive grains 36. A solution containing malic acid as acid and $H_2O_2$ as oxidizer and having a pH of 2 and an ORP of 700 mV was used as polishing solution 37 containing soft abrasive grains 36. A foam pad of polyurethane having a compressibility shown in Table 6 was used as polishing pad 38. An aluminum surface plate was used as surface plate 35. The polishing was performed under the conditions that the polishing pressure was the one shown in Table 6, the number of rotations of the n-type GaN crystal substrate (group III nitride crystal 1) and that of polishing pad 38 were both 30 rpm (rotations/min) to 100 rpm (rotations/min), and the polishing time was 60 minutes.

3. Abrasive-grain-free Polishing Step

The surface (Ga atomic surface of the low dislocation density region and N atomic surface of the high dislocation density region) of the n-type GaN crystal substrate (group III nitride crystal 1) was polished without abrasive grains, in a similar manner to Example A1, except that a solution containing malic acid as acid and TICA (trichloroisocyanuric acid) as oxidizer and having a pH of 2 and an ORP of 700 mV was used as polishing solution 27 without containing abrasive grains, a suede pad of polyurethane having a compressibility shown in Table 6 was used as polishing pad 28, a stainless surface plate was used as surface plate 25, and the polishing pressure was 19.6 kPa (200 $gf/cm^2$).

Through the above-described steps, surface treatment was performed on Examples F1 to F12 as shown in Table 6. For the crystal surface after treated, the impurity concentration, the depth of the depression in the high dislocation density region (namely the difference in level between the surface of the low dislocation density region and the surface of the high dislocation density region), the flat surface region ratio (namely the ratio (percentage) of the area of flat surface region 1ps of low dislocation density region 1k to the area of the whole surface 1ks of low dislocation density region 1k), surface roughness Ry and surface roughness Ra, and the thickness of the work-affected layer were measured. Here, the concentration of impurity Si (silicon), the depth of the depression in the high dislocation density region, the flat surface region ratio, and surface roughness Ry and surface roughness Ra were determined similarly to Example C1. Si is considered to be originated from the hard abrasive grains, namely SiC abrasive grains. The thickness of the work-affected layer was measured through observation by means of the TEM (transmission electron microscope) of a cross section appearing by cutting the crystal along a cleavage plane. The results are summarized in Table 6. TCIA in Table 6 represents trichloroisocyanuric acid.

4. Process of Manufacturing Group III Nitride Stack

Subsequently, referring to FIG. 5, the n-type GaN crystal substrate (group III nitride crystal 1) polished without abrasive grains for each of Examples F1 to F12 as described above was placed in an MOCVD apparatus. On one main surface (Ga atomic surface of the low dislocation density region and N atomic surface of the high dislocation density region) of the n-type GaN crystal substrate (group III nitride crystal 1), n-type semiconductor layer 620 including n-type GaN layer 621 (dopant: Si) of 1 μm in thickness and n-type $Al_{0.1}Ga_{0.9}N$ layer 622 (dopant: Si) of 150 nm in thickness, light emitting layer 640, and p-type semiconductor layer 630 including p-type $Al_{0.2}Ga_{0.8}N$ layer 631 (dopant: Mg) of 20 nm in thickness and p-type GaN layer 632 (dopant: Mg) of 150 nm in thickness were formed successively by the MOCVD method to produce group III nitride stack 500. Here, light emitting layer 640 has a multiple quantum well structure in which four barrier layers made up of GaN layers each having a thickness of 10 nm and three well layers made up of $Ga_{0.85}In_{0.15}N$ layers each having a thickness of 3 nm are alternately stacked on each other.

The PL (photoluminescence) method was used to cause thus obtained group III nitride stack 500 to emit light, and the intensity (PL intensity) of the light was measured. The results are summarized in Table 6.

5. Process of Manufacturing Group III Nitride Semiconductor Device

Further, referring to FIG. 6, on the other main surface (N atomic surface of the low dislocation density region and Ga atomic surface of the high dislocation density region) of the n-type GaN crystal substrate (group III nitride crystal 1) of group III nitride stack 500 for each of Examples F1 to F12 as described above, a stack structure made up of a Ti layer of 200 nm in thickness, an Al layer of 1000 nm in thickness, a Ti layer of 200 nm in thickness, and an Au layer of 2000 nm in thickness was formed and then heated in a nitrogen atmosphere to form an n side electrode of 100 μm in diameter as first electrode 661. On p-type GaN layer 632 of group III nitride stack 500, a stack structure made up of an Ni layer of 4 nm in thickness and an Au layer of 4 nm in thickness was formed and then heated in an inert gas atmosphere to form a p side electrode as second electrode 662. The above-described stack was formed into a chip of 400 μm×400 μm in size to produce an LED (light emitting diode) as group III nitride semiconductor device 600.

Subsequently, the p side electrode (second electrode 662) was bonded to conductor 682 with solder layer 670 while the n side electrode (first electrode 661) and conductor 681 were bonded together with wire 690 to produce semiconductor device 700 including the LED.

For each of the Examples, 200 semiconductor devices 700 including respective group III nitride semiconductor devices 600 as described above were manufactured to examine the properties of the devices. Of the manufactured devices, those having predetermined properties were extracted as effective products. The manufacturing yield (%) is shown in Table 6.

TABLE 6

| | | | Example F ||||||
| | | | Example F1 | Example F2 | Example F3 | Example F4 | Example F5 | Example F6 |
|---|---|---|---|---|---|---|---|---|
| lapping | abrasive grain | material | SiC | SiC | SiC | SiC | SiC | SiC |
| | | grain size (μm) | 4 | 4 | 4 | 4 | 4 | 4 |
| | surface plate | material | resin | resin | resin | resin | resin | resin |
| soft abrasive grain polishing | abrasive grain | material | $SiO_2$ | $SiO_2$ | $SiO_2$ | $SiO_2$ | $SiO_2$ | $SiO_2$ |
| | | grain size (μm) | 0.1 | 0.1 | 0.1 | 0.1 | 0.1 | 0.1 |
| | polishing solution | acid | malic acid | malic acid | malic acid | malic acid | malic acid | malic acid |
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 0.5 | 0.8 | 2 | 5 | 10 | 2 |
| | polishing pressure (kPa) | | 39.2 | 39.2 | 39.2 | 39.2 | 39.2 | 2.9 |
| abrasive-grain-free polishing | polishing solution | acid | malic acid | malic acid | malic acid | malic acid | malic acid | malic acid |
| | | oxidizer | TCIA | TCIA | TCIA | TCIA | TCIA | TCIA |
| | | pH | 2 | 2 | 2 | 2 | 2 | 2 |
| | | ORP (mV) | 1450 | 1450 | 1450 | 1450 | 1450 | 1450 |
| | compressibility of polishing pad (%) | | 8 | 8 | 8 | 8 | 8 | 8 |
| | polishing pressure (kPa) | | 19.6 | 19.6 | 19.6 | 19.6 | 19.6 | 19.6 |
| evaluation of crystal surface | impurity | Si ($\times 10^{10}$ cm$^{-2}$) | 1200 | 510 | 270 | 210 | 170 | 2500 |
| | depression depth of high dislocation density region (μm) | | 0.8 | 1.0 | 1.2 | 3.0 | 4.5 | 0.7 |
| | flat surface region ratio (%) | | 90 | 80 | 60 | 40 | 30 | 95 |
| | surface roughness Ry (nm) | | 62 | 18 | 33 | 25 | 46 | 30 |
| | surface roughness Ra (nm) | | 5.5 | 1.9 | 3.3 | 2.5 | 4.6 | 3.3 |
| | work-affected layer (nm) | | 300 | 30 | 0 | 50 | 50 | 500 |
| stack characteristic | PL intensity (AU) | | 28 | 68 | 100 | 53 | 18 | 22 |
| device characteristic | yield (%) | | 26 | 58 | 82 | 46 | 14 | 21 |

| | | | Example F ||||||
| | | | Example F7 | Example F8 | Example F9 | Example F10 | Example F11 | Example F12 |
|---|---|---|---|---|---|---|---|---|
| lapping | abrasive grain | material | SiC | SiC | SiC | SiC | SiC | SiC |
| | | grain size (μm) | 4 | 4 | 4 | 4 | 4 | 4 |
| | surface plate | material | resin | resin | resin | resin | resin | resin |
| soft abrasive grain | abrasive grain | material | $SiO_2$ | $SiO_2$ | $SiO_2$ | $SiO_2$ | $SiO_2$ | $SiO_2$ |
| | | grain size (μm) | 0.1 | 0.1 | 0.1 | 0.1 | 0.1 | 0.1 |

TABLE 6-continued

| polishing | polishing solution | acid | malic acid | malic acid | malic acid | malic acid | malic acid | malic acid |
|---|---|---|---|---|---|---|---|---|
| | | oxidizer | $H_2O_2$ | $H_2O_2$ | $H_2O_2$ | $H_2O_2$ | $H_2O_2$ | $H_2O_2$ |
| | | pH | 2 | 2 | 2 | 2 | 2 | 2 |
| | | ORP (mV) | 700 | 700 | 700 | 700 | 700 | 700 |
| | compressibility of polishing pad (%) | | 2 | 2 | 2 | 2 | 2 | 2 |
| | polishing pressure (kPa) | | 4.9 | 9.8 | 19.6 | 68.6 | 98.1 | 118 |
| abrasive-grain-free polishing | polishing solution | acid | malic acid | malic acid | malic acid | malic acid | malic acid | malic acid |
| | | oxidizer | TCIA | TCIA | TCIA | TCIA | TCIA | TCIA |
| | | pH | 2 | 2 | 2 | 2 | 2 | 2 |
| | | ORP (mV) | 1450 | 1450 | 1450 | 1450 | 1450 | 1450 |
| | compressibility of polishing pad (%) | | 8 | 8 | 8 | 8 | 8 | 8 |
| | polishing pressure (kPa) | | 19.6 | 19.6 | 19.6 | 19.6 | 19.6 | 19.6 |
| evaluation of crystal surface | impurity | Si ($\times 10^{10}$ cm$^{-2}$) | 710 | 620 | 460 | 220 | 90 | 40 |
| | depression depth of high dislocation density region (µm) | | 0.75 | 0.8 | 0.85 | 1.8 | 2.6 | 4.2 |
| | flat surface region ratio (%) | | 90 | 80 | 75 | 55 | 45 | 35 |
| | surface roughness Ry (nm) | | 19 | 5.2 | 4 | 4.1 | 8.4 | 15 |
| | surface roughness Ra (nm) | | 2.1 | 0.63 | 0.42 | 0.33 | 0.59 | 0.82 |
| | work-affected layer (nm) | | 50 | 20 | 0 | 0 | 30 | 30 |
| stack characteristic | PL intensity (AU) | | 50 | 71 | 92 | 95 | 46 | 15 |
| device characteristic | yield (%) | | 45 | 60 | 71 | 75 | 40 | 12 |

Referring to Table 6, as seen from Examples F1 to F12, through the surface treatment including the lapping step using hard abrasive grains with a Mohs hardness higher than 7 (SiC abrasive grains with a Mohs hardness of 9.5 for example), the soft abrasive grain polishing step using a polishing solution containing soft abrasive grains with a Mohs hardness of not more than 7 ($SiO_2$ abrasive grains with a Mohs hardness of 7 for example) and using a polishing pad with a compressibility of not less than 0.8% and not more than 5%, performed under the condition that the polishing pressure was not less than 4.9 kPa and not more than 98 kPa, and the abrasive-grain-free polishing step using a polishing solution without containing abrasive grains and having a pH of not less than 1 and not more than 6.5 and using a polishing pad with a compressibility of not less than 1.5% and not more than 20%, performed under the condition that the polishing pressure was not less than 0.98 kPa and not more than 58.8 kPa, the crystal surface having a low impurity concentration, a small depth of the depression in the high dislocation density regions a high flat surface region ratio, and small surface roughness Ry and small surface roughness Ra was obtained.

As for Example F1, the low compressibility of the polishing pad used in the soft abrasive grain polishing step increased surface roughness Ry and surface roughness Ra. As for Example F5, the high compressibility of the polishing pad used in the soft abrasive grain polishing step increased the depth of the depression in the high dislocation density region. As for Example F6, the low polishing pressure in the soft abrasive grain polishing step increased the concentration of impurity (Si) originated from the hard abrasive grains. As for Example F12, the high polishing pressure in the soft abrasive grain polishing step increased the depth of the depression in the high dislocation density region.

As for Examples F2 to F4 and F7 to F11, since the crystal surface had a low impurity concentration, a depth of the depression in the high dislocation density region of not more than 3 µm, and a flat surface region ratio of not less than 40%, the group III nitride stack had a high PL intensity, and accordingly the group III nitride semiconductor device was produced with high yield. In contrast, as for Example F1, the large surface roughness Ry and large surface roughness Ra as well as the large thickness of the work-affected layer decreased the PL intensity of the group III nitride stack, and accordingly the yield of the group III nitride semiconductor device was deteriorated. As for Example F6, the high impurity concentration of the crystal surface decreased the PL intensity of the group III nitride stack, and accordingly the yield of the group III nitride semiconductor device was deteriorated. As for Examples F5 and F12, the depth of the depression in the high dislocation density region that is larger than 3 µm and the flat surface region ratio of less than 40% decreased the PL intensity of the group III nitride stack, and accordingly the yield of the group III nitride semiconductor device was deteriorated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for surface treatment of a group III nitride crystal, comprising the steps of:
    lapping a surface of a group III nitride crystal using a hard abrasive grain with a Mohs hardness higher than 7; and
    abrasive-grain-free polishing for polishing said lapped surface of said group III nitride crystal using a polishing solution without containing abrasive grain,
    said polishing solution without containing abrasive grain having a pH of not less than 1 and not more than 6, or not less than 8.5 and not more than 14.

2. The method for surface treatment of a group III nitride crystal according to claim 1, wherein
    in said step of abrasive-grain-free polishing, polishing is performed using a polishing pad with a compressibility of not less than 1.5% and not more than 20% and at a polishing pressure of not less than 0.98 kPa and not more than 58.8 kPa.

3. The method for surface treatment of a group III nitride crystal according to claim 1, further comprising the step of soft-abrasive-grain polishing for polishing said lapped surface of said group III nitride crystal using a polishing solution containing a soft abrasive grain with a Mohs hardness of not more than 7, after said step of lapping and before said step of abrasive-grain-free polishing.

4. The method for surface treatment of a group III nitride crystal according to claim 3, wherein
in said step of soft-abrasive-grain polishing, polishing is performed using a polishing pad with a compressibility of not less than 0.8% and not more than 5% and at a polishing pressure of not less than 4.9 kPa and not more than 98 kPa.

5. A group III nitride crystal produced through the surface treatment as recited in claim 1.

6. The group III nitride crystal according to claim 5, wherein
a surface roughness Ra of the group III nitride crystal is not more than 2 nm.

7. The group III nitride crystal according to claim 5, wherein
a work-affected layer of the group III nitride crystal has a thickness of not more than 50 nm.

8. The group III nitride crystal according to claim 5, wherein
said group III nitride crystal includes a high dislocation density region and a low dislocation density region, and a difference in level between a surface of said low dislocation density region and a surface of said high dislocation density region is not more than 3 μm.

9. The group III nitride crystal according to claim 5, wherein
said group III nitride crystal includes a high dislocation density region and a low dislocation density region, and a flat surface region of said low dislocation density region has an area of not less than 40% of the whole surface of said low dislocation density region.

10. A group III nitride stack comprising the group III nitride crystal as recited in claim 5 and at least one group III nitride layer epitaxially grown on a surface of said group III nitride crystal.

11. A method for manufacturing a group III nitride stack using the group III nitride crystal as recited in claim 5, comprising the steps of:
preparing said group III nitride crystal; and
epitaxially growing at least one group III nitride layer (650) on a surface of said group III nitride crystal.

12. A group III nitride semiconductor device comprising:
the group III nitride crystal as recited in claim 5;
at least one group III nitride layer epitaxially grown on a surface of the group III nitride crystal; and
an electrode formed on at least one of a surface of an outermost layer of said group III nitride layer and a surface of said group III nitride crystal.

13. A method for manufacturing a group III nitride semiconductor device using the group III nitride crystal as recited in claim 5, comprising the steps of:
preparing said group III nitride crystal;
epitaxially growing at least one group III nitride layer on a surface of said group III nitride crystal; and
forming an electrode on at least one of a surface of an outermost layer of said group III nitride layer and a surface of said group III nitride crystal.

* * * * *